United States Patent
Kim et al.

(10) Patent No.: US 11,815,982 B2
(45) Date of Patent: *Nov. 14, 2023

(54) OPERATING METHOD OF A NONVOLATILE MEMORY DEVICE FOR PROGRAMMING MULTIPAGE DATA

(71) Applicant: SAMSUNG ELECTRONICS CO., LTD., Suwon-si (KR)

(72) Inventors: Wandong Kim, Siheung-si (KR); Jinyoung Kim, Seoul (KR); Sehwan Park, Yongin-si (KR); Hyun Seo, Goyang-si (KR); Sangwan Nam, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/968,912

(22) Filed: Oct. 19, 2022

(65) Prior Publication Data

US 2023/0044730 A1 Feb. 9, 2023

Related U.S. Application Data

(63) Continuation of application No. 17/233,816, filed on Apr. 19, 2021, now Pat. No. 11,500,706.

(30) Foreign Application Priority Data

Aug. 18, 2020 (KR) .................. 10-2020-0103435

(51) Int. Cl.
*G11C 7/00* (2006.01)
*G06F 11/07* (2006.01)
(Continued)

(52) U.S. Cl.
CPC ........ *G06F 11/0727* (2013.01); *G06F 11/076* (2013.01); *G06F 11/0757* (2013.01);
(Continued)

(58) Field of Classification Search
CPC ....... G11C 7/1078; G11C 7/22; G11C 7/1066; G11C 7/1072; G11C 7/1096
(Continued)

(56) References Cited

U.S. PATENT DOCUMENTS 7,965,553 B2 6/2011 Han
8,760,921 B2 6/2014 Kawase et al.
(Continued)

OTHER PUBLICATIONS

Zhang et al., "FPGA-Based Failure Mode Testing and Analysis for MLC NAND Flash Memory", 2017 Design, Automation and Test in Europe, pp. 434-439.
(Continued)

*Primary Examiner* — Son T Dinh
(74) *Attorney, Agent, or Firm* — F. Chau & Associates, LLC

(57) ABSTRACT

An operating method of a nonvolatile memory device for programming multi-page data, the operating method including: receiving the multi-page data from a memory controller; programming first page data among the multi-page data to first memory cells connected to a word line adjacent to a selected word line; reading previous page data previously stored in second memory cells connected to the selected word line based on a first sensing value and a second sensing value after programming the first page data; calculating a first fail bit number by comparing first bits of the previous page data read based on the first sensing value to second bits of the previous page data read based on the second sensing value; and programming the previous page data read from the second memory cells and second page data among the
(Continued)

multi-page data to the second memory cells based on the first fail bit number.

20 Claims, 30 Drawing Sheets

(51) Int. Cl.
  *G11C 16/04*  (2006.01)
  *G11C 16/10*  (2006.01)
  *G11C 16/26*  (2006.01)
  *G11C 11/56*  (2006.01)
  *G11C 16/34*  (2006.01)

(52) U.S. Cl.
  CPC .......... *G11C 16/0483* (2013.01); *G11C 16/10* (2013.01); *G11C 16/26* (2013.01); *G11C 11/56* (2013.01); *G11C 16/34* (2013.01)

(58) Field of Classification Search
  USPC ........................................ 365/189.14, 189.16
  See application file for complete search history.

(56) References Cited

U.S. PATENT DOCUMENTS

| | | | |
|---|---|---|---|
| 9,123,422 B2 | 9/2015 | Yu et al. | |
| 9,368,223 B2 | 6/2016 | Jung et al. | |
| 9,607,696 B2 | 3/2017 | Birk et al. | |
| 9,619,321 B1 | 4/2017 | Haratsch et al. | |
| 10,055,294 B2 | 8/2018 | Hyun et al. | |
| 10,353,622 B2 | 7/2019 | Haratsch et al. | |
| 10,714,162 B2 | 7/2020 | Koh | |
| 11,500,706 B2* | 11/2022 | Kim .................... G11C 11/5628 | |
| 2009/0185421 A1 | 7/2009 | Yun et al. | |
| 2010/0002506 A1 | 1/2010 | Cho et al. | |
| 2014/0215122 A1* | 7/2014 | Li ....................... G06F 11/1666 |
| | | | 711/103 |
| 2019/0042130 A1 | 2/2019 | Vittal Prabhu et al. | |
| 2019/0163363 A1 | 5/2019 | Lin et al. | |
| 2019/0206497 A1 | 7/2019 | Lim | |
| 2019/0214088 A1 | 7/2019 | Kwak et al. | |
| 2020/0143891 A1 | 5/2020 | Takeyama | |
| 2020/0234780 A1 | 7/2020 | Papandreou et al. | |
| 2022/0057968 A1 | 2/2022 | Kim et al. | |

OTHER PUBLICATIONS

European Search Report issued in corresponding EP Patent Application No. 21174205.1 dated Nov. 11, 2021.

* cited by examiner

FIG. 11

| | MC11 | MC21 | MC31 | MC41 | MC51 | MC61 | MC71 |
|---|---|---|---|---|---|---|---|
| PDS1 | 0 | 1 | 0 | 1 | 1 | 1 | 1 |
| PDS2 | 0 | 0 | 1 | 0 | 1 | 1 | 1 |
| CR | 0 | 1 | 1 | 1 | 0 | 0 | 0 |
| FBN | 3 | | | | | | |

Failing Cell: MC21–MC41

OPERATING METHOD OF A NONVOLATILE MEMORY DEVICE FOR PROGRAMMING MULTIPAGE DATA

CROSS-REFERENCE TO RELATED APPLICATIONS

This application is a continuation of U.S. patent application Ser. No. 17/233,816 filed on Apr. 19, 2021, which claims priority under 35 U.S.C. § 119 to Korean Patent Application No. 10-2020-0103435, filed on Aug. 18, 2020, in the Korean Intellectual Property Office, the disclosures of which are incorporated by reference herein in their entireties.

TECHNICAL FIELD

The inventive concept relates to a semiconductor device, and more particularly, to an operating method of a nonvolatile memory device for programming multi-page data.

DISCUSSION OF RELATED ART

Semiconductor memory devices are classified as volatile memory devices and nonvolatile memory devices. Volatile memory devices, such as static random access memory (SRAM), dynamic RAM (DRAM), etc., lose stored data in the absence of power. Nonvolatile memory devices, such as a flash memory device, phase change RAM (PRAM), magnetoresistive RAM (MRAM), resistive RAM (RRAM), ferroelectric RAM (FRAM), etc., retain stored data even when power is removed.

Among nonvolatile memory devices, a flash memory device may perform a program operation in page units or word line units. The flash memory device may program data (e.g., multi-page data) corresponding to a plurality of pages to memory cells connected to a selected word line. In this case, each of the memory cells may store a plurality of bits.

When a high program voltage is applied to the selected word line during a multi-page data programming process, memory cells connected to a word line adjacent to the selected word line may deteriorate. To reduce this deterioration, a technique may be employed in which, during one program cycle, some page data among multi-page data is first programmed and then the remaining page data among the multi-page data is programmed. According to this technique, the reliability of the flash memory device may degrade due to errors that may occur when programming some of the page data.

SUMMARY

According to an embodiment of the inventive concept, there is provided an operating method of a nonvolatile memory device for programming multi-page data, the operating method including: receiving the multi-page data from a memory controller; programming first page data among the multi-page data to first memory cells connected to a word line adjacent to a selected word line, reading previous page data previously stored in second memory cells connected to the selected word line based on a first sensing value and a second sensing value after programming the first page data; calculating a first fail bit number by comparing first bits of the previous page data read based on the first sensing value to second bits of the previous page data read based on the second sensing value; and programming the previous page data read from the second memory cells and second page data among the multi-page data to the second memory cells based on the first fail bit number.

According to an embodiment of the inventive concept, there is provided an operating method of a nonvolatile memory device for programming multi-page data, the operating method including: receiving first page data among the multi-page data from a memory controller; programming the first page data to memory cells connected to a selected word line; receiving second page data among the multi-page data from the memory controller after programming the first page data; reading the first page data stored in the memory cells based on a first sensing value and a second sensing value after receiving the second page data; calculating a first fail bit number by comparing first bits of the first page data read based on the first sensing value to second bits of the first page data read based on the second sensing value; and programming the first page data read from the memory cells and the second page data to the memory cells based on the first fail bit number.

According to an embodiment of the inventive concept, there is provided an operating method of a nonvolatile memory device for programming multi-page data, the operating method including: receiving the multi-page data from a memory controller; programming at least one page data among the multi-page data to first memory cells connected to a word line adjacent to a selected word line; reading at least one previous page data previously stored in second memory cells connected to the selected word line based on a first read voltage and a second read voltage after programming the at least one page data; programming the at least one previous page data read from the second memory cells and remaining page data among the multi-page data to the second memory cells, when a number of failing cells having a threshold voltage between the first read voltage and the second read voltage among the second memory cells is less than a reference value; and transmitting state information indicating a program fail with respect to the multi-page data to the memory controller, when the number of failing cells is greater than or equal to the reference value.

According to an embodiment of the inventive concept, there is provided a memory device including; a memory cell array including first memory cells connected to a first word line and second memory cells connected to a second word line adjacent to the first word line; a control logic circuit configured to program first page data among multi-page data to the second memory cells in response to a program command provided from a memory controller; a page buffer unit configured to read previous page data previously stored in the first memory cells based on a first sensing value and a second sensing value; and a fail bit calculator configured to calculate a first fail bit number by comparing first bits of the previous page data read based on the first sensing value to second bits of the previous page data read based on the second sensing value, wherein the control logic circuit is further configured to program the previous page data read from the first memory cells and second page data among the multi-page data to the first memory cells according to the first fail bit number.

According to an embodiment of the inventive concept, there is provided an operating method of a nonvolatile memory device for programming multi-page data, the operating method including: receiving the multi-page data from a memory controller; programming first page data among the multi-page data to first memory cells connected to a word line adjacent to a selected word line; reading previous page data previously stored in second memory cells connected to the selected word line based on a first sensing value and a second sensing value after programming the first page data; and programming the previous page data read from the second memory cells and second page data among the multi-page data to the second memory cells based on a bit error value.

BRIEF DESCRIPTION OF THE DRAWINGS

Embodiments of the inventive concept will be more clearly understood from the following detailed description taken in conjunction with the accompanying drawings in which:

FIG. 11 is a diagram illustrating an example of a fail bit number calculated according to an operation of the fail bit calculator of FIG. 10;

DETAILED DESCRIPTION OF THE EMBODIMENTS

Hereinafter, embodiments of the inventive concept will be described with reference to the accompanying drawings.

Figure 1:
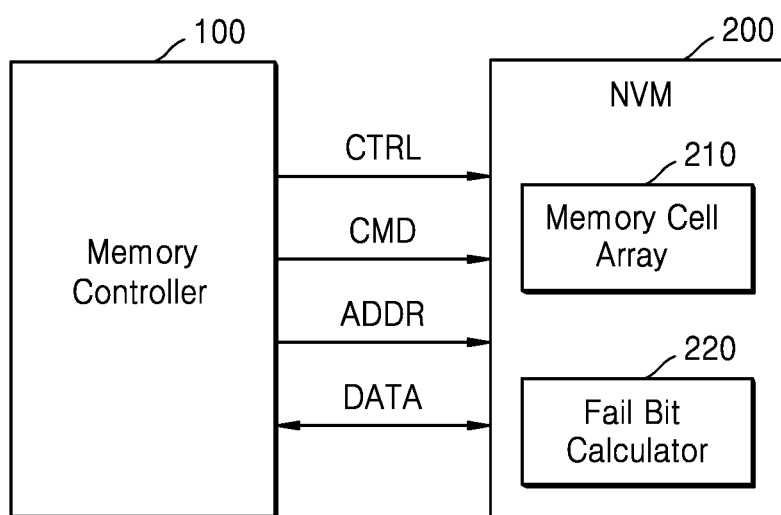
FIG. 1 is a block diagram illustrating a memory system according to an embodiment of the inventive concept.

FIG. 1 is a block diagram illustrating a memory system 10 according to an embodiment of the inventive concept. Referring to FIG. 1, the memory system 10 may include a memory controller 100 and a nonvolatile memory device NVM 200. The memory system 10 may be included in or mounted on electronic devices such as personal computers (PCs), servers, data centers, smartphones, tablet PCs, autonomous vehicles, portable game consoles, wearable devices, and the like. For example, the memory system 10 may be a storage device such as a solid state drive (SSD).

The memory controller 100 may control all operations of the nonvolatile memory device 200. For example, the memory controller 100 may provide a control signal CTRL, a command CMD, and/or an address ADDR to the nonvolatile memory device 200 and control the nonvolatile memory device 200. In an embodiment of the inventive concept, the memory controller 100 may control the nonvolatile memory device 200 to store data DATA or output the data DATA in response to a request from an external host.

The nonvolatile memory device 200 may operate under the control of the memory controller 100. In an embodiment of the inventive concept, the nonvolatile memory device 200 may output the stored data DATA under control of the memory controller 100 or may store the data DATA provided from the memory controller 100.

The nonvolatile memory device 200 may include a memory cell array 210 and a fail bit calculator 220. The memory cell array 210 may include a plurality of memory cells. For example, the plurality of memory cells may be flash memory cells. However, the inventive concept is not limited thereto, and the memory cells may include Resistive Random Access Memory (RRAM) cells, Ferroelectric Random Access Memory (FRAM) cells, Phase Change Random Access Memory (PRAM) cells, Thyristor Random Access Memory (TRAM) cells, and Magnetic Random Access Memory (MRAM) cells. Hereinafter, embodiments of the inventive concept will be described in which the memory cells are NAND flash memory cells.

In an embodiment of the inventive concept, each of the plurality of memory cells included in the memory cell array 210 may store N-bit data (N is a positive integer). When N is 1, a memory cell may be referred to as a single level cell (SLC). When N is 2 or more, a memory cell may be referred to as a multilevel cell (MLC). For example, when N is 3, the memory cell may be referred to as a triple level cell (TLC). For example, when N is 4, the memory cell may be referred to as a quadruple level cell (QLC).

In an embodiment of the inventive concept, the nonvolatile memory device 200 may program multi-page data to memory cells connected to one word line. In this case, each of the memory cells connected to the word line may store two or more bits. For example, in the TLC mode, the nonvolatile memory device 200 may program three page data to the memory cells. In the QLC mode, the nonvolatile memory device 200 may program four page data to the memory cells.

In an embodiment of the inventive concept, the nonvolatile memory device 200 may perform a program operation (e.g., a multi-page program operation) on multi-page data through one program cycle. One program cycle for the multi-page program operation may include a program operation on at least one page data among the multi-page data and a program operation on the remaining page data among the multi-page data. In other words, the nonvolatile memory device 200 may perform the multi-page program operation through a plurality of program operations.

The nonvolatile memory device 200 may read the data DATA from the memory cells connected to one word line. In this case, the nonvolatile memory device 200 may read the data DATA (e.g., page data) stored in the memory cells in a page unit. In an embodiment of the inventive concept, the nonvolatile memory device 200 may read the page data stored in memory cells connected to the same word line based on two sensing values (e.g., a first sensing value obtained through first sensing and a second sensing value obtained through second sensing). For example, the nonvolatile memory device 200 may read page data from specific memory cells based on a first read voltage having a first level and detect first bits, and may read page data from specific memory cells based on a second read voltage having a second level and detect second bits. In an embodiment of the inventive concept, a read operation performed based on two sensing values may be performed together with the plurality of program operations described above in one program cycle for the multi-page program operation.

The fail bit calculator 220 may calculate the number of fail bits (e.g., a fail bit number) of the page data programmed to the memory cells based on the page data read based on the two sensing values. Here, the fail bits may be bits of page data that are estimated to be different from bits of the original page data. In other words, the error level of the programmed page data may be determined based on the calculated number of fail bits. For example, the fail bit calculator 220 may calculate a fail bit number by comparing the first bits of page data read based on the first sensing value (e.g., first sensing data) to the second bits of page data read based on the second sensing value (e.g., second sensing data).

In an embodiment of the inventive concept, the fail bit calculator 220 may calculate the fail bit number of the programmed page data while the multi-page program operation is being performed. In this case, the calculated number of fail bits may be used to increase the reliability of multi-page data to be programmed. Accordingly, the reliability of the nonvolatile memory device 200 may be increased.

Hereinafter, embodiments of the multi-page program operation using the calculated number of fail bits will be described in detail.

Figure 2:
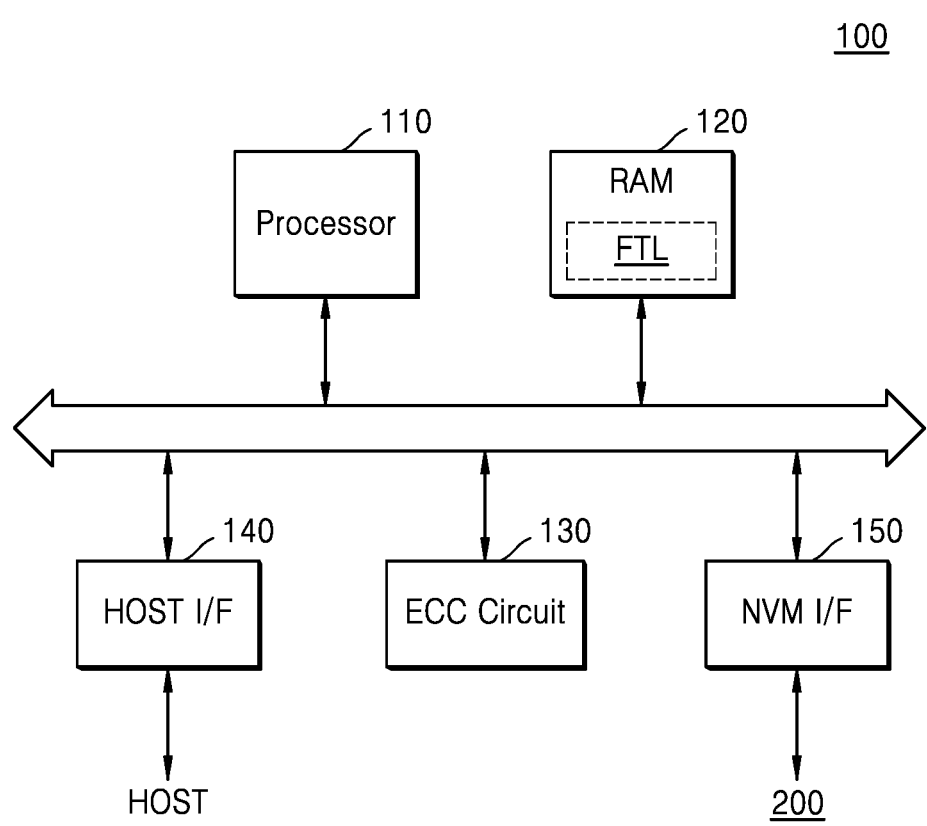
FIG. 2 is a block diagram illustrating a memory controller of FIG. 1.

FIG. 2 is a block diagram illustrating the memory controller 100 of FIG. 1. Referring to FIGS. 1 and 2, the memory controller 100 may include a processor 110, RAM 120, an error correction code (ECC) circuit 130, a host interface circuit 140, and a memory interface circuit 150.

The processor 110 may control all operations of the memory controller 100. The RAM 120 may be used as an operating memory, a buffer memory, a cache memory, or the like of the memory controller 100. Various information, data, or instructions included in the RAM 120 may be executed or managed by the processor 110.

In an embodiment of the inventive concept, the RAM 120 may include a flash translation layer FTL. The flash translation layer FTL may be an interface between a host HOST and the nonvolatile memory device 200. For example, the flash translation layer FTL may perform address translation in which a logical address managed by the host HOST is translated into a physical address identifiable by the nonvolatile memory device 200. In other words, the physical storage space of the nonvolatile memory device 200 may be managed by the flash translation layer FTL. In an embodiment of the inventive concept, the flash translation layer FTL may be stored in the RAM 120, and the flash translation layer FTL stored in the RAM 120 may be executed by the processor 110.

The ECC circuit 130 may be configured to detect and correct an error of the data DATA output from the nonvolatile memory device 200. For example, the ECC circuit 130 may generate an error correction code with respect to the data DATA to be stored in the nonvolatile memory device 200. The error correction code may be stored in the nonvolatile memory device 200 together with the data DATA. When the data DATA is output from the nonvolatile memory device 200, the ECC circuit 130 may use the error correction code corresponding to the data DATA to detect and correct an error of the data DATA output from the nonvolatile memory device 200.

The host interface circuit 140 may support communication between the memory controller 100 and the host HOST. In an embodiment of the inventive concept, the host interface circuit 140 may support at least one of various interfaces such as Universal Serial Bus (USB), Small Computer System Interface (SCSI), peripheral component interconnect (PCI) express, advanced technology attachment (ATA), Parallel ATA (PATA), Serial ATA (SATA), Serial Attached SCSI (SAS), Universal Flash Storage (UFS), Nonvolatile Memory Express NVMe), and the like.

The memory interface circuit 150 may support communication between the memory controller 100 and the nonvolatile memory device 200. In an embodiment of the inventive concept, the memory interface circuit 150 may support a NAND interface.

Figure 3:
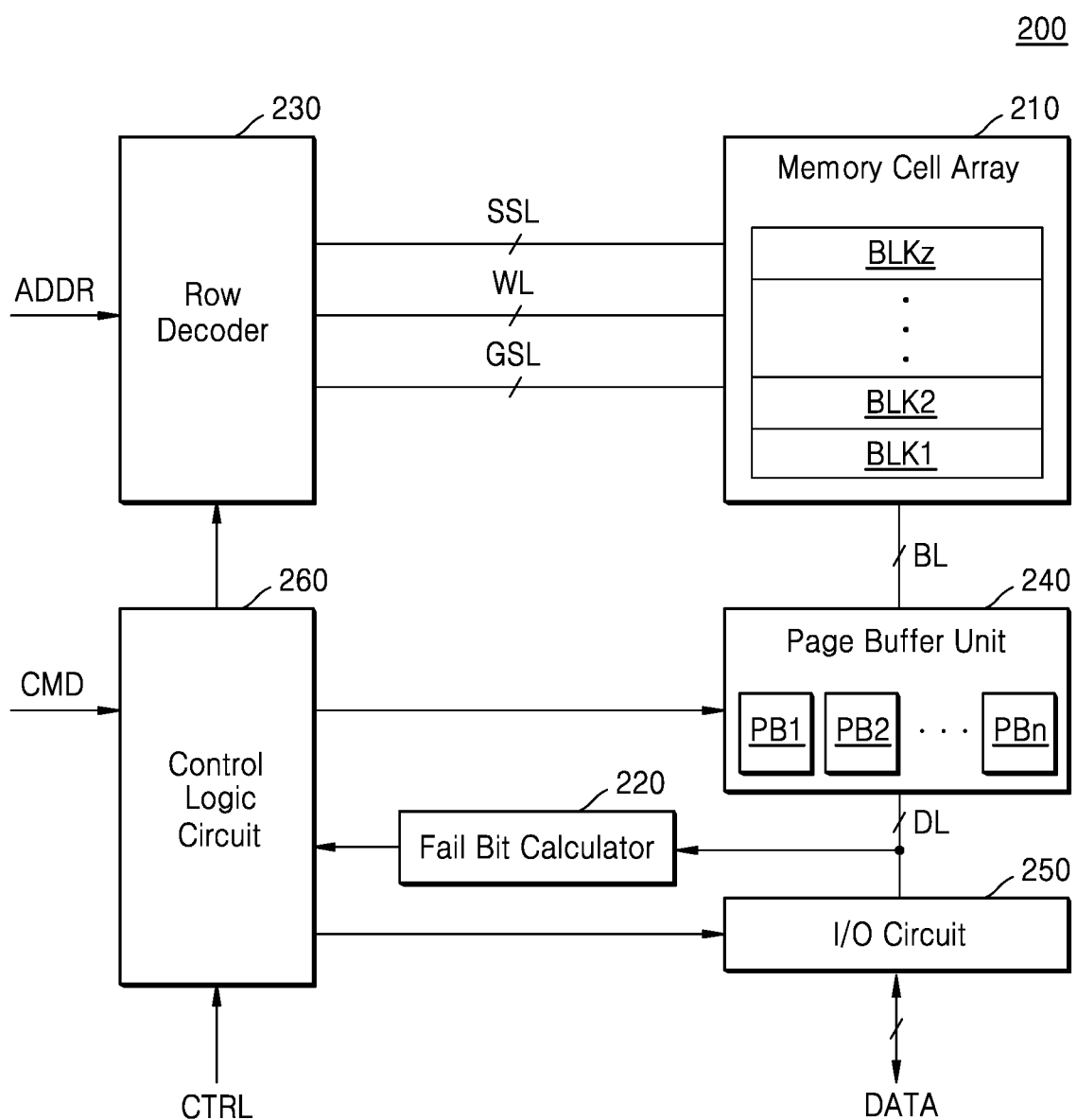
FIG. 3 is a block diagram illustrating a nonvolatile memory device of FIG. 1.

FIG. 3 is a block diagram illustrating the nonvolatile memory device 200 of FIG. 1. Referring to FIGS. 1 and 3, the nonvolatile memory device 200 may include a memory cell array 210, a fail bit calculator 220, a row decoder 230, a page buffer unit 240, an input/output (I/O) circuit 250, and a control logic circuit 260.

The memory cell array 210 may include a plurality of memory blocks BLK1 to BLKz (z is a positive integer). Each of the plurality of memory blocks BLK1 to BLKz may include a plurality of memory cells. The memory cell array 210 may be connected to the page buffer unit 240 through bit lines BL, and may be connected to the row decoder 230 through word lines WL, string select lines SSL, and ground select lines GSL.

In an embodiment of the inventive concept, the memory cell array 210 may include a three-dimensional (3D) memory cell array, and the 3D memory cell array may include a plurality of NAND strings. Each NAND string may include memory cells respectively connected to word lines vertically stacked on a substrate. The disclosures of U.S. Pat. Nos. 7,679,133, 8,553,466, 8,654,587, and 8,559,235, and U.S. Patent Application Publication No. 2011/0233648, which describe 3D memories, are incorporated by reference herein in their entireties. In an embodiment of the inventive concept, the memory cell array 210 may include a two-dimensional (2D) memory cell array, and the 2D memory cell array may include a plurality of NAND strings arranged in row and column directions.

The row decoder 230 may receive the address ADDR from the memory controller 100. The row decoder 230 may decode the address ADDR and control voltages of the word lines WL, the string select lines SSL, and the ground select lines GSL based on a result of the decoding. For example, during a program operation, the row decoder 230 may apply a program voltage and a program verify voltage to a selected word line, and, during a read operation, the row decoder 230 may apply a read voltage to the selected word line.

The page buffer unit 240 may include a plurality of page buffers PB1 to PBn (n is 3 or an integer greater than 3), and the page buffers PB1 to PBn may be respectively connected to memory cells through a plurality of bit lines BL. The page buffer unit 240 may select at least one bit line from among the bit lines BL according to the control of the control logic circuit 260. The page buffer unit 240 may operate as a write driver or a sense amplifier according to an operation mode. For example, during the program operation, the page buffer unit 240 may apply a bit line voltage corresponding to the data DATA to be programmed to a selected bit line. During the read operation, the page buffer unit 240 may sense the current or voltage of the selected bit line and read the data DATA stored in the memory cell. The page buffer unit 240 may temporarily store the data DATA to be programmed or temporarily store the data DATA read from the memory cell.

In an embodiment of the inventive concept, during the read operation, the page buffer unit 240 may read page data stored in memory cells connected to one word line based on two sensing values. Accordingly, the page buffer unit 240 may temporarily store first sensing data corresponding to a first sensing value and second sensing data corresponding to a second sensing value.

The I/O circuit 250 may provide the data DATA received from the memory controller 100 to the page buffer unit 240 through data lines DL or may provide the data DATA received from the page buffer unit 240 to the memory controller 100 through the data lines DL. In an embodiment of the inventive concept, signals such as the command CMD, the address ADDR, or the control signal CTRL shown in FIG. 3 may be received through the input/output circuit 250.

The control logic circuit 260 may control all operations of the nonvolatile memory device 200. For example, the control logic circuit 260 may control elements of the nonvolatile memory device 200 to perform various operations (e.g., a program operation, a read operation, an erasure operation, etc.) based on the command CMD or the control signal CTRL from the memory controller 100.

The fail bit calculator 220 may calculate the fail bit number of the data DATA programmed to the memory cells based on the data DATA read from the memory cells through the page buffer unit 240. In other words, the fail bit number of the programmed page data may be calculated through the fail bit calculator 220. In an embodiment of the inventive concept, the fail bit calculator 220 may compare the first sensing data to the second sensing data read through the page buffer unit 240 and calculate the fail bit number. The calculated fail bit number may be provided to the control logic circuit 260.

In an embodiment of the inventive concept, the control logic circuit 260 may control a multi-page program operation based on the fail bit number. For example, while performing the multi-page program operation, the control logic circuit 260 may determine the error level of first programmed page data according to the fail bit number of first programmed page data. The control logic circuit 260 may control the multi-page program operation based on the determined error level.

Figure 4:
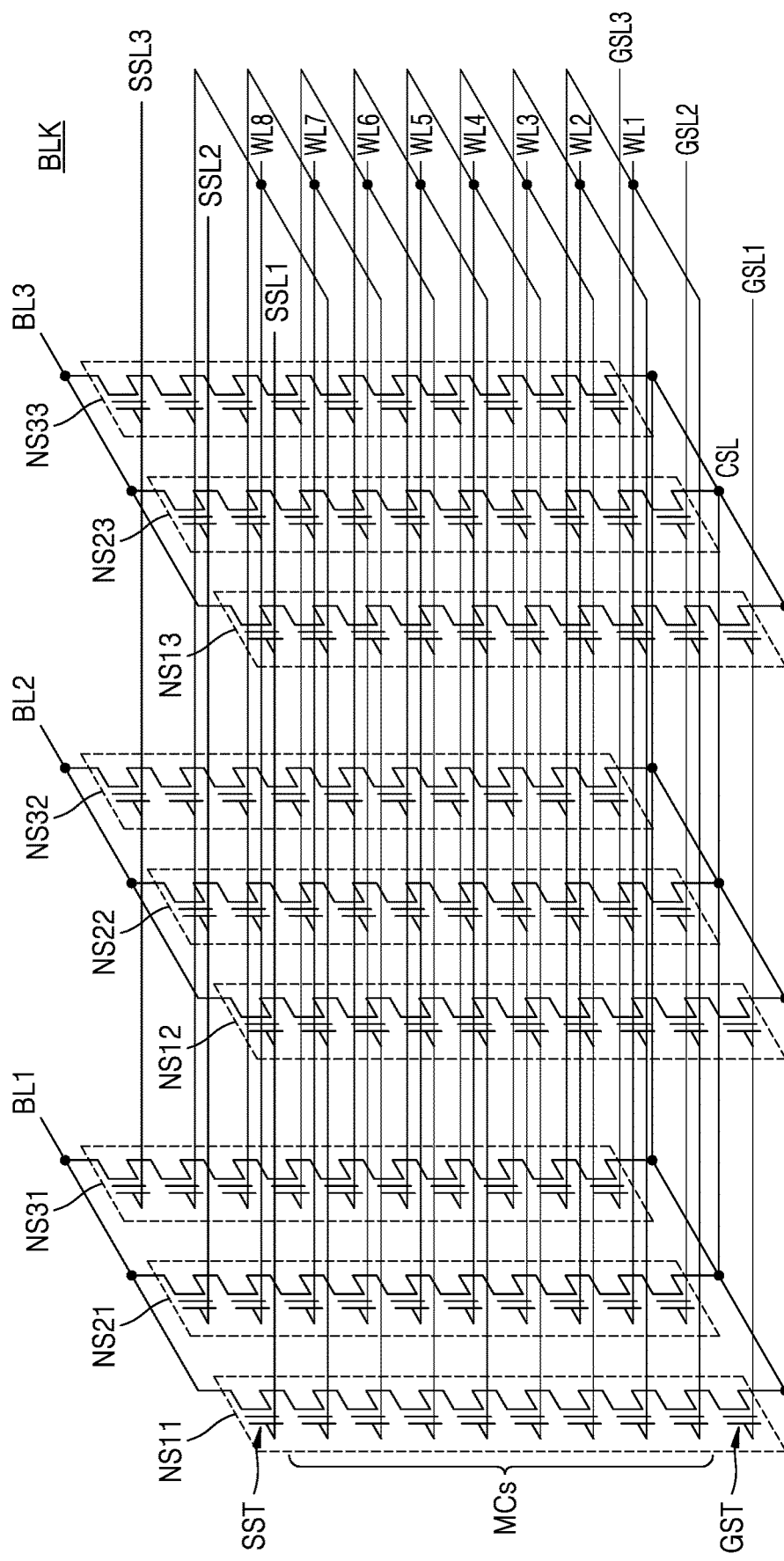
FIG. 4 is a circuit diagram illustrating a memory block according to an embodiment of the inventive concept.

FIG. 4 is a circuit diagram illustrating a memory block according to an embodiment of the inventive concept. Referring to FIG. 4, the memory block BLK may correspond to one of the memory blocks BLK1 to BLKz of FIG. 3. The memory block BLK may include NAND strings NS11 to NS33. Each NAND string (e.g., NS11) may include a string select transistor SST, a plurality of memory cells MCs, and a ground select transistor GST connected in series.

The NAND strings NS11, NS21, and NS31 may be between a first bit line BL1 and a common source line CSL, the NAND strings NS12, NS22, and NS32 may be between a second bit line BL2 and the common source line CSL, and NAND strings NS13, NS23, and NS33 may be between a third bit line BL3 and the common source line CSL. The string select transistor SST may be connected to corresponding string select lines SSL1 to SSL3. The memory cells MCs may be connected to corresponding word lines WL1 to WL8, respectively. The ground selection transistor GST may be connected to corresponding ground select lines GSL1 to GSL3. The string select transistor SST may be connected to the corresponding bit lines BL1 to BL3, and the ground select transistor GST may be connected to the common source line CSL. Here, the number of NAND strings, the number of word lines, the number of bit lines, the number of ground select lines, and the number of string select lines may vary according to embodiments of the inventive concept.

In the following description, multi-page program operations according to various embodiments of the inventive concept will be described with reference to FIGS. 5A to 23. For convenience of explanation, it is assumed that the multi-page program operations according to embodiments of the inventive concept program three page data PD1 to PD3 (e.g., a TLC mode) based on the address ADDR indicating the first word line WL1 (e.g., the first word line WL1 is a selected word line). However, the inventive concept is not limited thereto, and the inventive concept may also be applied to multi-page program operations on four or more page data.

Figure 5A:
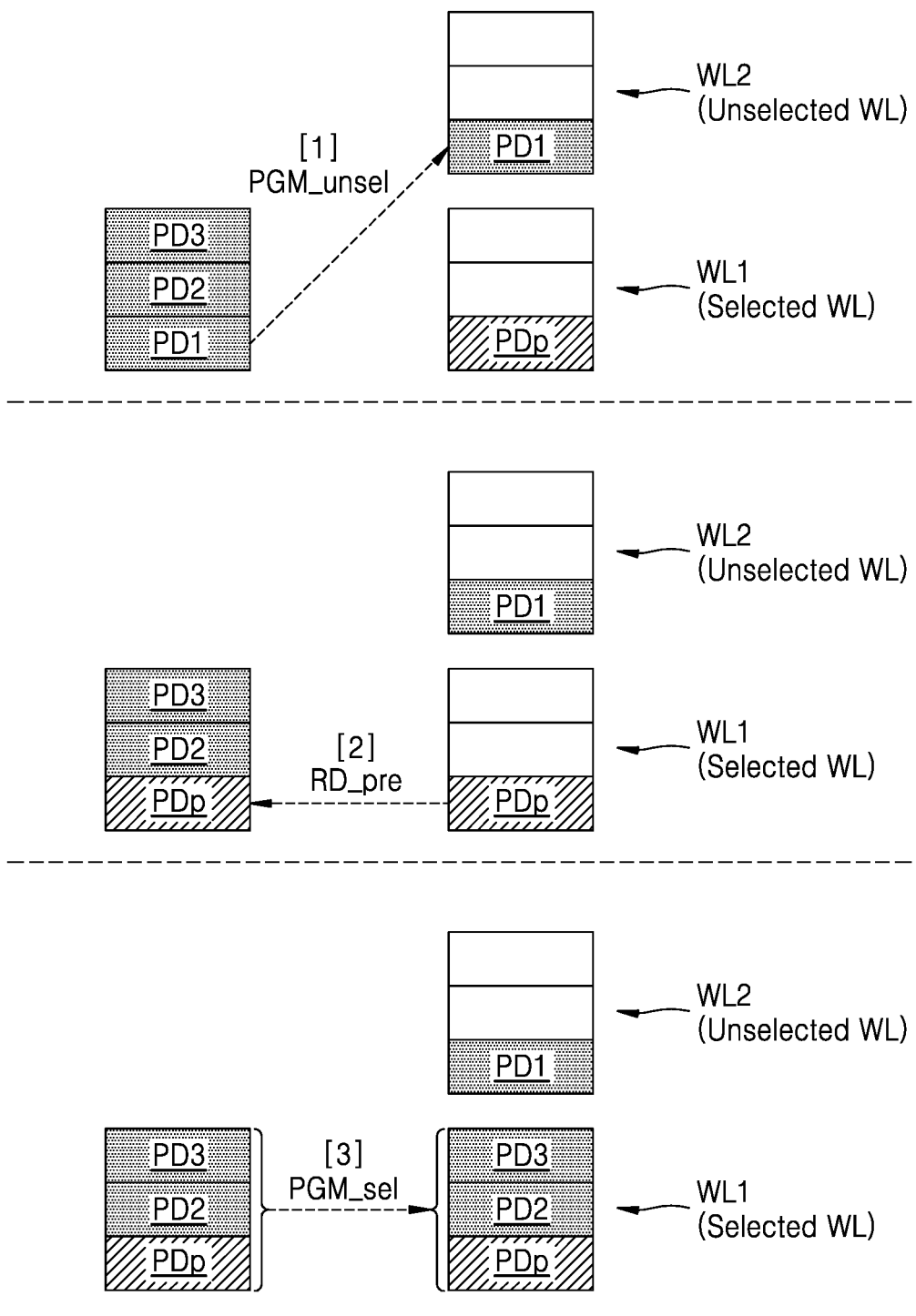
FIGS. 5A and 5B are diagrams illustrating a program technique with respect to multi-page data according to an embodiment of the inventive concept.
Figure 5B:
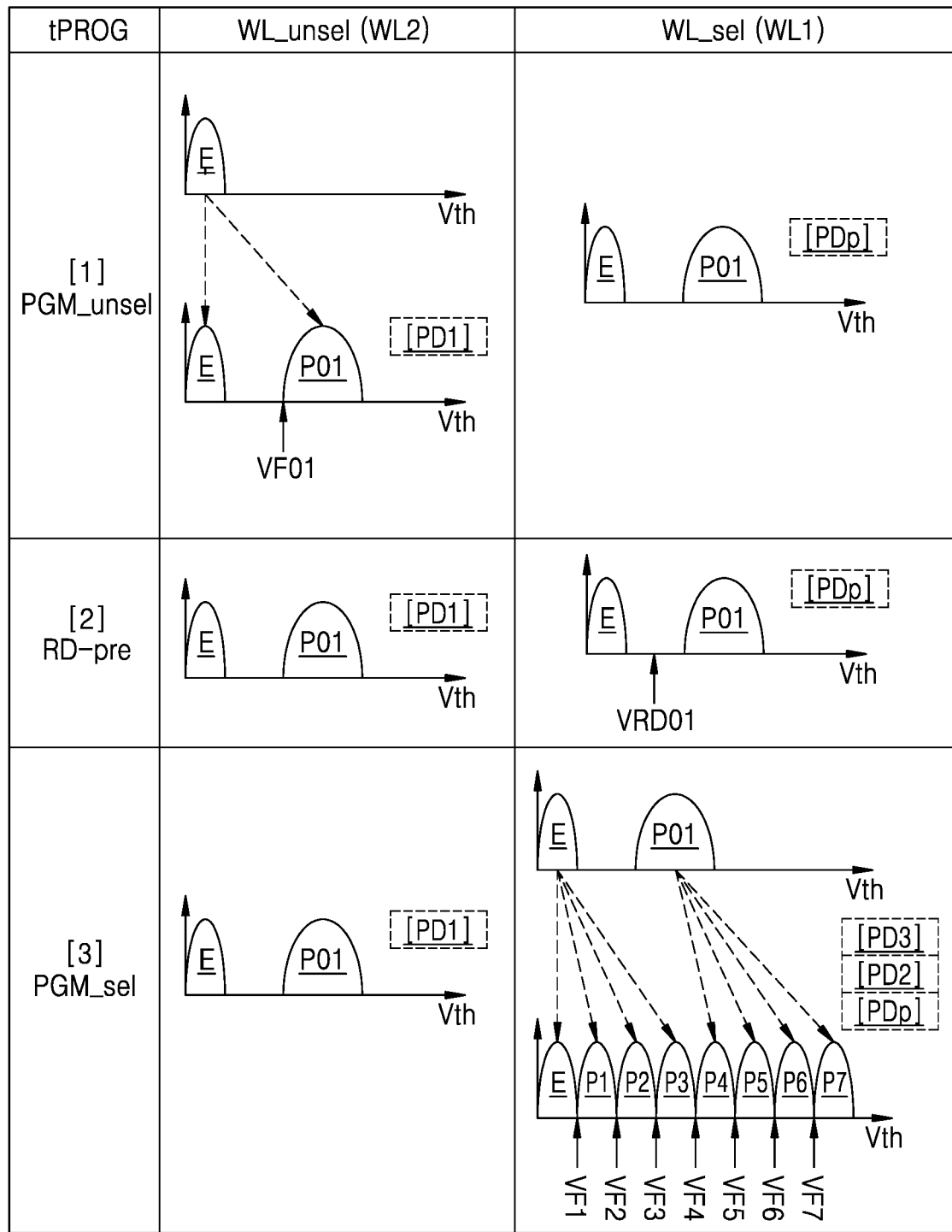

FIGS. 5A and 5B are diagrams illustrating a program technique with respect to multi-page data according to an embodiment of the inventive concept. The operations of FIGS. 5A and 5B may be performed in one program cycle for a multi-page program operation. For convenience of explanation, it is assumed that memory cells connected to the first word line WL1 store one previous page data PDp in a previous program cycle. In other words, the one previous page data PDp among three page data programmed in the previous program cycle may be previously stored in the memory cells connected to the first word line WL1. The horizontal axes of a dispersion shown in FIG. 5B indicate threshold voltages of memory cells, and the vertical axes indicate the number of memory cells.

Referring to FIGS. 3, 5A, and 5B, the nonvolatile memory device 200 may receive first to third page data PD1 to PD3. In an embodiment of the inventive concept, the received first to third page data PD1 to PD3 may be stored in the page buffer unit 240 of the nonvolatile memory device 200.

The nonvolatile memory device 200 may program one (e.g., the first page data PD1) of the first to third page data PD1 to PD3 to memory cells connected to the second word line WL2, which is an unselected word line (hereinafter this program operation may be referred to as an unselected program operation PGM_unsel). For example, the second word line WL2 may be a word line adjacent to the first word line WL1. As shown in FIG. 5B, the nonvolatile memory device 200 may perform the unselected program operation PGM_unsel such that the memory cells connected to the second word line WL2 are in any one of an erasure state E and a program state P01. In the unselected program operation PGM_unsel, an unselected program verify voltage VF01 may be used to verify the program state P01. When the unselected program operation PGM_unsel on the second word line WL2 is completed, the memory cells connected to the second word line WL2 may be in a state in which the first page data PD1 is stored, and the memory cells connected to the first word line WL1 may be in a state in which the previous page data PDp is stored.

After the unselected program operation PGM_unsel, the nonvolatile memory device 200 may read the previous page data PDp from the memory cells connected to the first word line WL1 (hereinafter this read operation may be referred to as a previous page data read operation RD_pre). As shown in FIG. 5B, each of the memory cells in which the previous page data PDp is stored may have any one of the erasure state E and the program state P01. The nonvolatile memory device 200 may perform the previous page data read operation RD_pre using a read voltage VRD01, thereby reading the previous page data PDp.

After the previous page data read operation RD_pre, the nonvolatile memory device 200 may perform a program operation (hereinafter this program operation may be referred to as a selected program operation PGM_sel) on the memory cells connected to the first word line WL1 based on the second page data PD2, the third page data PD3, and the previous page data PDp. As shown in FIG. 5B, as the nonvolatile memory device 200 performs the selected program operation PGM_sel, the memory cells in the erasure state E among the memory cells connected to the first word line WL1 may be in any one of the erasure state E and the first to third program states P1 to P3 and the memory cells in the program state P01 may be in any one of the fourth to seventh program states P4 to P7. In the selected program operation PMG_sel, first to seventh program verify voltages VF1 to VF7 may be used to verify the first to seventh program states P1 to P7.

When the selected program operation PGM_sel is completed, the memory cells connected to the first word line WL1 may store the second page data PD2, the third page data PD3, and the previous page data PDp, and the memory cells connected to the second word line WL2 may store the first page data PD1.

Figure 6A:
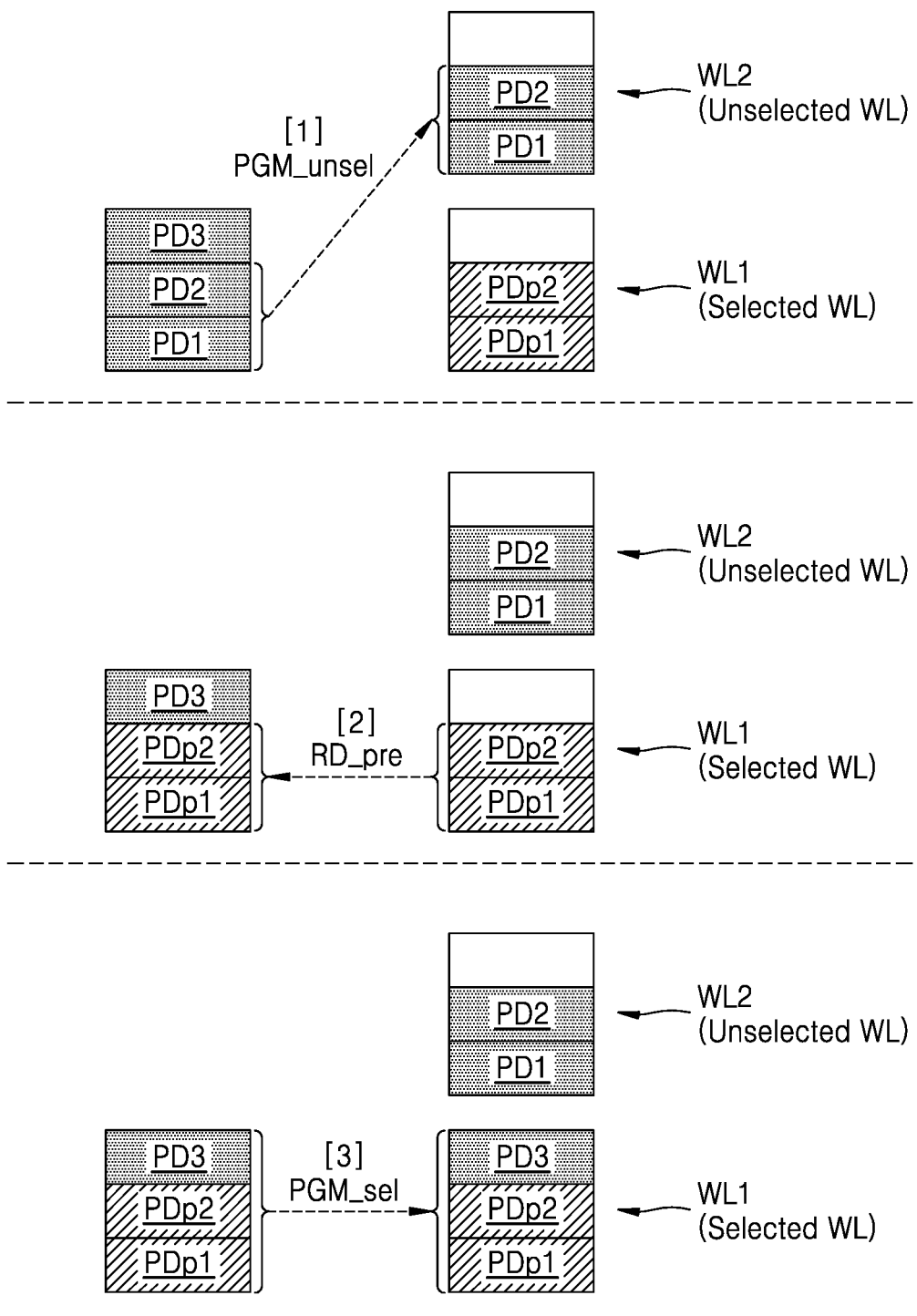
FIGS. 6A and 6B are diagrams illustrating a program technique with respect to multi-page data according to an embodiment of the inventive concept.
Figure 6B:
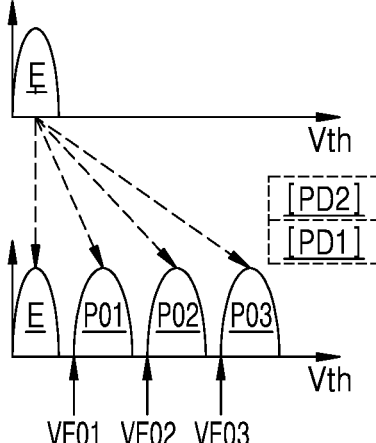

FIGS. 6A and 6B are diagrams illustrating a program technique with respect to multi-page data according to an embodiment of the inventive concept. The operations of FIGS. 6A and 6B may be performed in one program cycle for a multi-page program operation. For convenience of explanation, it is assumed that the memory cells connected to the first word line WL1 store two previous page data PDp1 and PDp2 in a previous program cycle. In other words, the two page data PDp1 and PDp2 among three page data programmed in the previous program cycle may be previously stored in the memory cells connected to the first word line WL1. The horizontal axes of dispersions shown in FIG. 6B indicate threshold voltages of memory cells, and the vertical axes indicate the number of memory cells.

Referring to FIGS. 3, 6A, and 6B, the nonvolatile memory device 200 may receive the first to third page data PD1 to PD3. The nonvolatile memory device 200 may program two page data (e.g., the first and second page data PD1 and PD2) among the first to third page data PD1 to PD3 to memory cells connected to the second word line WL2, which is an unselected word line. As shown in FIG. 6B, the nonvolatile memory device 200 may perform the unselected program operation PGM_unsel such that the memory cells connected to the second word line WL2 are in any one of the erasure state E and the first to third program states P01 to P03. In the unselected program operation PGM_unsel, first to third unselected program verify voltages VF01 to VF03 may be used to verify the first to third program states P01 to P03. When the unselected program operation PGM_unsel on the second word line WL2 is completed, the memory cells connected to the second word line WL2 may be in a state in which the first and second page data PD1 and PD2 are stored, and the memory cells connected to the first word line WL1 may be in a state in which first and second previous page data PDp1 and PDp2 are stored.

After the unselected program operation PGM_unsel, the nonvolatile memory device 200 may read the first and second previous page data PDp1 and PDp2 from the memory cells connected to the first word line WL1. As shown in FIG. 6B, each of the memory cells in which the first and second previous page data PDp1 and PDp2 are stored may have any one of the erasure state E and the first to third program states P01 to P03. The nonvolatile memory device 200 may perform the previous page data read operation RD_pre using first to third read voltages VRD01 to VRD03, thereby reading the first and second previous page data PDp1 and PDp2.

After the previous page data read operation RD_pre, the nonvolatile memory device 200 may perform a program operation on the memory cells connected to the first word line WL1 based on the third page data PD3 and the first and second previous page data PDp1 and PDp2. As shown in FIG. 6B, as the nonvolatile memory device 200 performs the selected program operation PGM_sel, the memory cells in the erasure state E among the memory cells connected to the first word line WL1 may be in any one of the erasure state E and the first program state P1 and the memory cells in the first program state P01 may be in any one of the second and third program states P2 and P3. The memory cells in the second program state P02 may have any one of the fourth and fifth program states P4 and P5, and the memory cells in the third program state P03 may have any one of the sixth and seventh program states P6 and P7.

When the selected program operation PGM_sel is completed, the memory cells connected to the first word line WL1 may store the third page data PD3 and the first and second previous page data PDp1 and PDp2, and the memory cells connected to the second word line WL2 may store the first page data PD1 and the second page data PD2.

In an embodiment of the inventive concept, the first word line WL1, which is the selected word line, may be a word line positioned close to a substrate, and the second word line WL2, which is the unselected word line, may be a word line positioned far from the substrate. However, the inventive concept is not limited thereto. For example, the first word line WL1 may be a word line positioned far from the substrate, and the second word line WL2 may be a word line positioned close to the substrate.

As described above, the multi-page program techniques according to embodiments of the inventive concept may include an operation of programming at least one page data among multi-page data to memory cells connected to the unselected word line adjacent to the selected word line (e.g., the unselected program operation PGM_unsel) and an operation of programming the remaining page data to memory cells connected to the selected word line (e.g., the selected program operation PGM_sel). For example, first page data may be programmed to memory cells connected to an unselected wordline adjacent to a selected wordline, and then, second and third page data may be programmed to memory cells connected to the selected wordline. In this case, at least one previous page data previously stored in the memory cells connected to the selected word line may be read, and the selected program operation PGM_sel may be performed based on the read at least one previous page data and the remaining page data. According to these program techniques, the reliability of page data programmed through the selected program operation PGM_sel may be reduced due to errors occurring when a program operation on previous page data is performed in a previous program cycle.

Hereinafter, multi-page program operations for increasing the reliability of the program techniques described with reference to FIGS. 5A through 6B will be described in detail with reference to FIGS. 7 through 17. For convenience of explanation, as illustrated in FIGS. 5A and 5B, the multi-page program operations will be described in which the unselected program operation PGM_unsel is performed on one page data.

Figure 7:
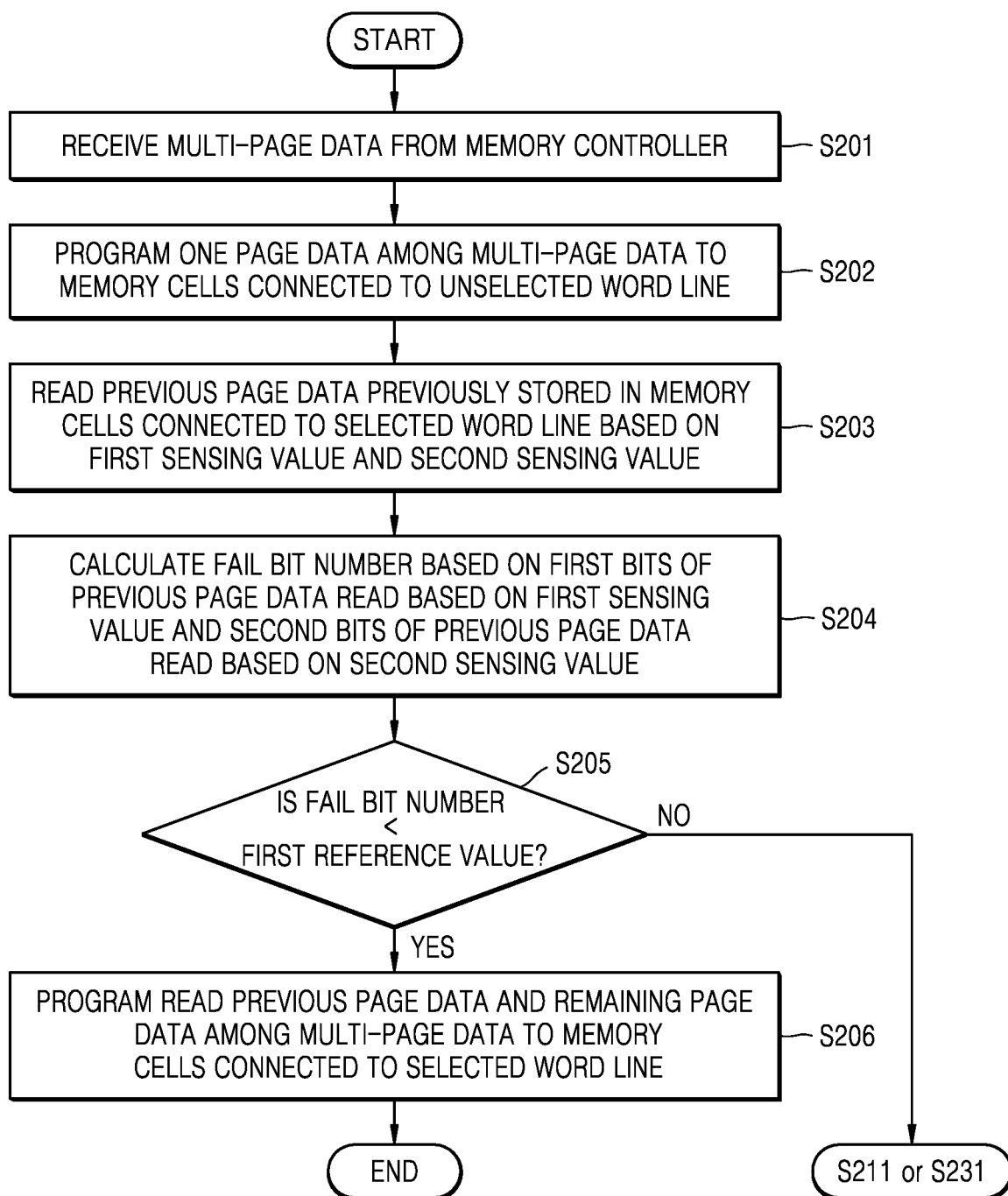
FIG. 7 is a flowchart illustrating a program operation on multi-page data of the nonvolatile memory device of FIG. 1 according to the program technique of FIGS. 5A and 5B.

FIG. 7 is a flowchart illustrating a program operation on multi-page data of the nonvolatile memory device 200 of FIG. 1 according to program techniques of FIGS. 5A and 5B. Referring to FIGS. 1, 3, and 7, in operation S201, the nonvolatile memory device 200 may receive multi-page data from the memory controller 100. For example, the nonvolatile memory device 200 may further receive the address ADDR corresponding to a selected word line and the program command CMD with respect to multi-page data along with the multi-page data received from the memory controller 100.

In operation S202, the nonvolatile memory device 200 may program one page data among the multi-page data to memory cells connected to an unselected word line. For example, first page data PD1 may be programmed to second word line WL2.

In operation S203, the nonvolatile memory device 200 may read previous page data previously stored in memory cells connected to the selected word line based on a first sensing value and a second sensing value. For example, the nonvolatile memory device 200 may apply a first read voltage to the selected word line to read the previous page data, and apply a second read voltage to the selected word line to read the previous page data. As another example, the nonvolatile memory device 200 may apply a specific read voltage (e.g., a read voltage having a previously set level) to the selected word line and sense the voltage or current of a sensing node of the page buffer unit 240 at a first sensing time point and a second sensing time point, thereby reading the previous page data. More specifically, the nonvolatile memory device 200 may apply a specific read voltage to the selected word line and develop the sensing node of the page buffer unit 240 during a first develop time and a second develop time, thereby reading the previous page data. Accordingly, the page buffer unit 240 may store the first sensing data read based on the first sensing value and the second sensing data read based on the second sensing value.

In operation S204, the nonvolatile memory device 200 may calculate a fail bit number based on first bits of the previous page data (e.g., the first sensing data) read based on the first sensing value and second bits of the previous page data (e.g., the sensing data) read based on the second sensing value. For example, the fail bit calculator 220 may compare the first bits to the second bits and determine the number of different bits. The fail bit calculator 220 may calculate the determined number of bits as the fail bit number.

In operation S205, the nonvolatile memory device 200 may determine whether the fail bit number is less than a first reference value. Here, the first reference value may be a reference value for determining whether to continue to perform a multi-page program operation. For example, operation S205 may be performed by the control logic circuit 260.

When the fail bit number is less than the first reference value (in other words, when it is determined that an error level of programmed previous page data is low), in operation S206, the nonvolatile memory device 200 may program the read previous page data and the remaining page data among the multi-page data to the memory cells connected to the selected word line. For example, the read previous page data may be data read based on the first sensing value or the second sensing value. As another example, the read previous page data may be data read based on a previously set read voltage.

When the fail bit number is greater than or equal to the first reference value (e.g., it is determined that the error level of the programmed previous page data is not low), the nonvolatile memory device 200 may perform operation S211 or operation S231. Operation S211 will be described later with reference to FIG. 12, and operation S231 will be described later with reference to FIG. 15. For example, the nonvolatile memory device 200 may process the multi-page program operation as a fail, correct an error of the read previous page data, or read the previous page data again based on other sensing values.

Figure 8:
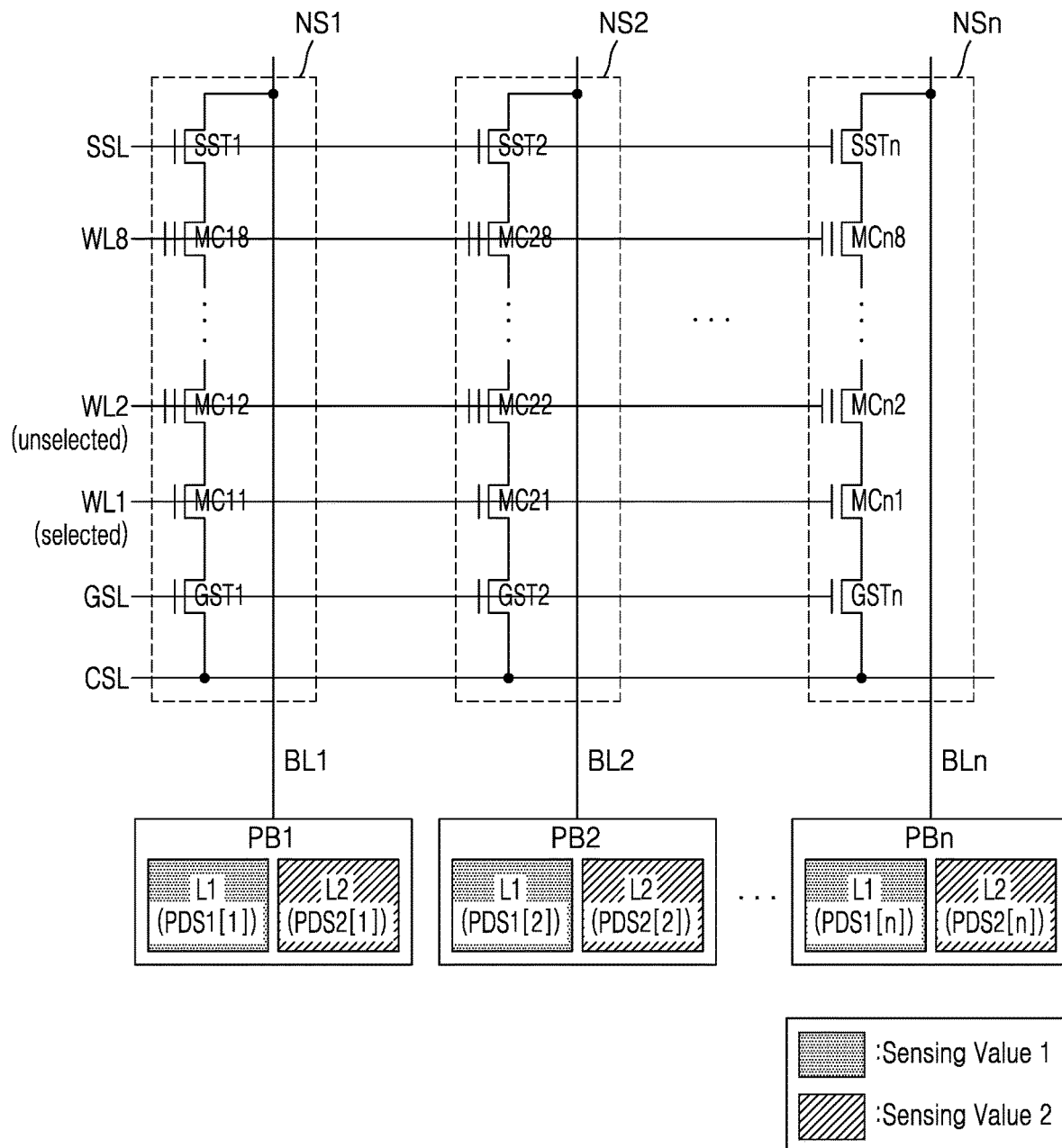
FIG. 8 is a diagram illustrating an operation of reading previous page data in a multi-page program operation of FIG. 7.

FIG. 8 is a diagram illustrating an operation of reading previous page data in a multi-page program operation of FIG. 7. Referring to FIGS. 3 and 8, the NAND strings NS1 to NSn may be connected to page buffers PB1 to PBn through the bit lines BL1 to BLn, respectively. The NAND strings NS1 to NSn may be included in the memory cell array 210, and the page buffers PB1 to PBn may be included in the page buffer unit 240.

The NAND strings NS1 to NSn may include ground select transistors GST1 to GSTn, memory cells MC11 to MCn8, and string select transistors SST1 to SSTn. The ground select transistors GST1 to GSTn may be connected to the common source line CSL and the ground select line GSL, and the memory cells MC11 to MCn8 may be connected to the word lines WL1 to WL8. The string select transistors SST1 to SSTn may be connected to the string select line SSL and the bit lines BL1 to BLn.

As illustrated in FIG. 8, the first word line WL1 may be a selected word line, and the second word line WL2 may be an unselected word line. In this case, the memory cells MC11 to MCn1 connected to the first word line WL1 are in a state in which the previous page data is programmed, and the memory cells MC12 to MCn2 connected to the second word line WL2 according to operation S202 of FIG. 7 may be in a state in which one of multi-page data is programmed.

When the previous page data is read from the memory cells MC11 to MCn1 connected to the first word line WL1 based on the first sensing value and the second sensing value according to operation S203 of FIG. 7, the page buffers PB1 to PBn may store first sensing data PDS1 and second sensing data PDS2. The first sensing data PDS1 may be stored in first latches L1s of the page buffers PB1 to PBn, and the second sensing data PDS2 may be stored in second latches L2s of the page buffers PB1 to PBn. For example, each of the first sensing data PDS1 and the second sensing data PDS2 may be n-bit data. In this case, bits PDS1[1:n] of the first sensing data PDS1 may be respectively stored in the first latches L1s of the page buffers PB1 to PBn, and bits PDS2[1:n] of the second sensing data PDS2 may be respectively stored in the second latches L2s of the page buffers PB1 to PBn. For example, bit PDS1[1] of the first sensing data PDS1 output from the memory cell MC11 based on the first sensing value may be stored in the first latch L1 of the first page buffer PB1, and bit PDS2[1] of the second sensing data PDS2 output from the memory cell MC11 based on the second sensing value may be stored in the second latch L2 of the first page buffer PB1. Similarly, bit PDS1[n] of the first sensing data PDS1 output from the memory cell MCn1 based on the first sensing value may be stored in the first latch L1 of the nth page buffer PBn, and bit PDS2[n] of the second sensing data PDS2 output from the memory cell MCn1 based on the second sensing value may be stored in the second latch L2 of the nth page buffer PBn.

Figure 9A:
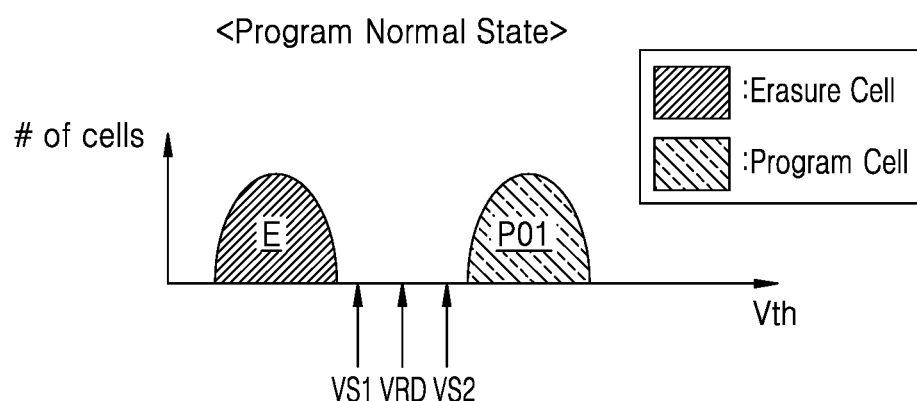
FIG. 9A is a diagram illustrating a method of reading previous page data based on two read voltages according to an embodiment of the inventive concept.
Figure 9A:
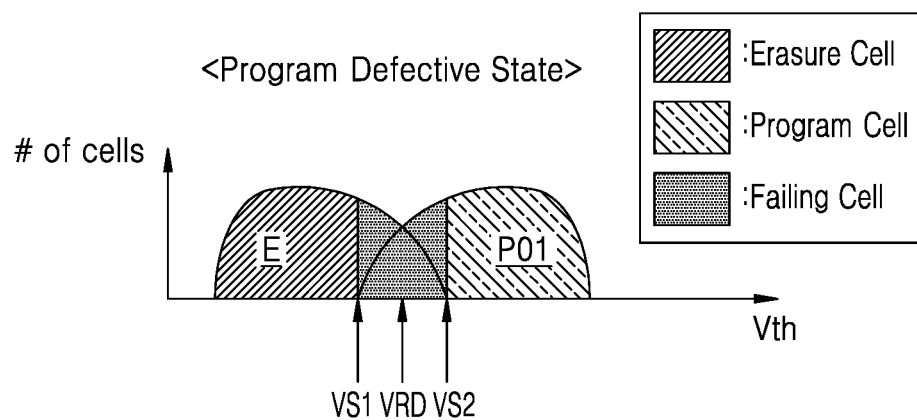

FIG. 9A is a diagram illustrating a method of reading previous page data based on two read voltages. The horizontal axes of dispersions of FIG. 9A indicate threshold voltages of memory cells, and the vertical axes indicate the number of memory cells. Referring to FIG. 9A, when previous page data is programmed to memory cells, distributions of the memory cells in a program normal state and distributions of the memory cells in a program defective state are illustrated. The program normal state indicates a state in which an error level of the programmed previous page data is relatively low, and the program defective state indicates a state in which the error level of the programmed previous page data is relatively high. As described with reference to FIG. 5B, each of the memory cells in which the previous page data is stored may have one of the erasure state E and the program state P01.

In the program normal state and the program defective state, a first read voltage VS1 may be applied to a selected word line (e.g., the first word line WL1) of FIG. 8 to read the previous page data based on the first sensing value, and a second read voltage VS2 may be applied to the selected word line to read the previous page data based on the second sensing value. The first read voltage VS1 may be lower than a reference read voltage VRD, and the second read voltage VS2 may be higher than the reference read voltage VRD. The reference read voltage VRD may be a voltage for reading the previous page data in a general read operation performed based on one sensing value. For example, the reference read voltage VRD may correspond to the read voltage VRD01 of FIG. 5B and may have a previously set level. However, the inventive concept is not limited thereto, and the level of the first read voltage VS1 or the level of the second read voltage VS2 may be the same as the level of the reference read voltage VRD.

In the program normal state, threshold voltages of memory cells in the erasure state E and threshold voltages of memory cells in the program state P01 may be different from each other. For example, as shown in FIG. 9A, the maximum voltage among the threshold voltages of the memory cells in the erasure state E may be lower than the first read voltage VS1, and the minimum voltage among the threshold voltages of the memory cells in the program state P01 may be higher than the second read voltage VS2. In this case, there is no memory cell in a threshold voltage between the first read voltage VS1 and the second read voltage VS2. In other words, bits of the previous page data read based on the first read voltage VS1 may be the same as bits of the previous page data read based on the second read voltage VS2. As described above, the memory cells in the erasure state E may be identified as memory cells (e.g., erasure cells) in which a first bit (e.g., '1') is stored by the first read voltage VS1 and the second read voltage VS2, and the memory cells in the program state P01 may be identified as memory cells (e.g., program cells) in which a second bit (e.g., '0') is stored by the first read voltage VS1 and the second read voltage VS2. In this case, it may be calculated that the fail bit number is 0.

In the program defective state, some of the threshold voltages of the memory cells in the erasure state E may be the same as some of the threshold voltages of the memory cells in the program state P01. In other words, some of the threshold voltages of the memory cells in the erasure state E may overlap with some of the threshold voltages of the memory cells in the program state P01. For example, as shown in FIG. 9A, the maximum voltage among threshold voltages of memory cells in the erasure state E may be higher than the first read voltage VS1, and the minimum voltage among the threshold voltages of memory cells in the program state P01 may be lower than the second read voltage VS2. In this case, there may be a memory cell in the threshold voltage between the first read voltage VS1 and the second read voltage VS2. In other words, some of the bits of the previous page data read based on the first read voltage VS1 may be different from some of the bits of the previous page data read based on the second read voltage VS2. For example, with regard to memory cells having a threshold voltage higher than the first read voltage VS1 among the memory cells in the erasure state E, bits sensed based on the first read voltage VS1 may be different from bits sensed based on the second read voltage VS2. In addition, with regard to memory cells having a threshold voltage lower than the second read voltage VS2 among the memory cells in the program state P01, the bits sensed based on the first read voltage VS1 may be different from the bits sensed based on the second read voltage VS2. As described above, among the memory cells in the erasure state E, the memory cells having the threshold voltage lower than the first read voltage VS1 may be identified as the erasure cells, and the memory cells having the threshold voltage higher than the first read voltage VS1 may be identified as memory cells (e.g., failing cells) in which different bits are stored by the first read voltage VS1 and the second read voltage VS2. In addition, among the memory cells in the program state P01, the memory cells having a threshold voltage higher than the second read voltage VS2 may be identified as program cells, and the memory cells having a threshold voltage lower than the second read voltage VS2 may be identified as failing cells. In other words, the failing cells may be memory cells having the threshold voltage between the first read voltage VS1 and the second read voltage VS2. In this case, the calculated fail bit number may be the same as the number of failing cells.

Figure 9B:
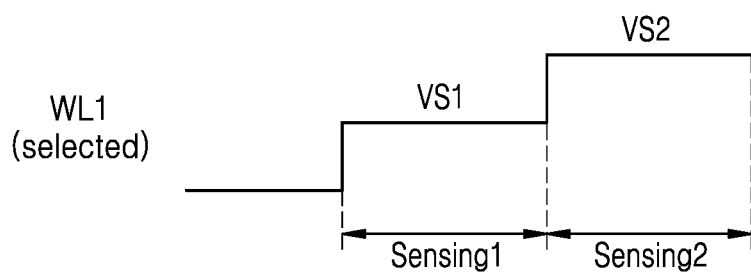
FIG. 9B is a diagram illustrating an example of applying the read voltages of FIG. 9A to a selected word line according to an embodiment of the inventive concept.

FIG. 9B is a diagram illustrating an example of applying the first and second read voltages VS1 and VS2 of FIG. 9A to a selected word line. Referring to FIG. 9B, as described with reference to FIG. 9A, the first and second read voltages VS1 and VS2 may be applied to the first word line WL1 (e.g., the selected word line) based on two sensing values. For example, first sensing and second sensing may be performed by sequentially applying the first read voltage VS1 and the second read voltage VS2 to the first word line WL1. The fail bit number may be calculated based on the first sensing and the second sensing.

Figure 9C:
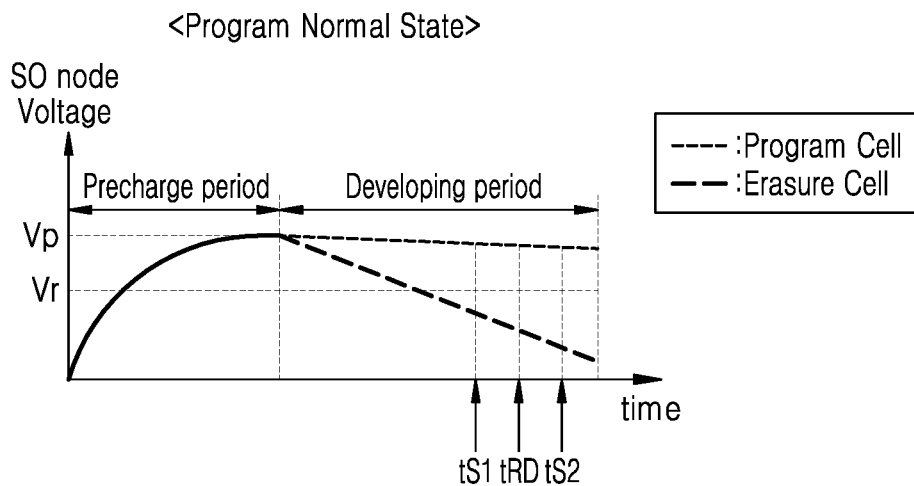
FIG. 9C is a diagram illustrating a method of reading previous page data based on two sensing time points according to an embodiment of the inventive concept.
Figure 9C:
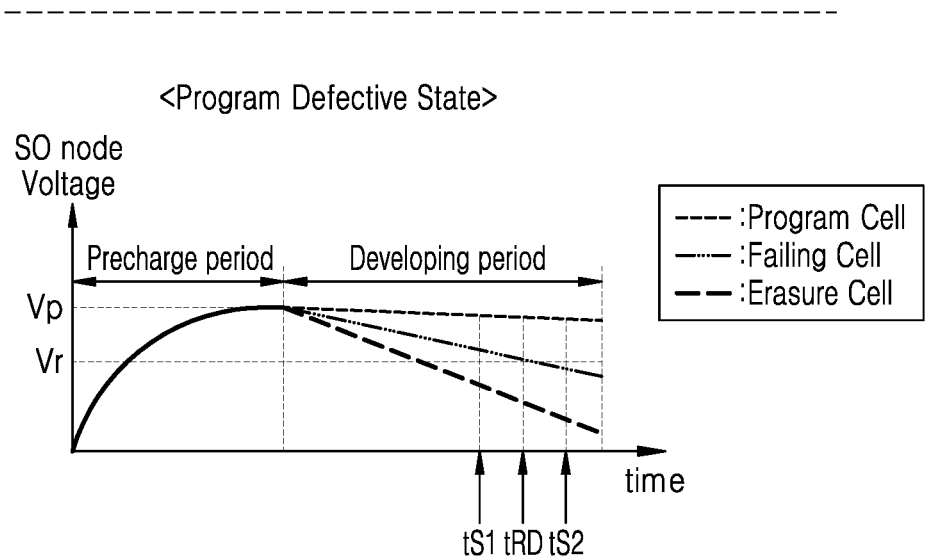

FIG. 9C is a diagram illustrating a method of reading previous page data based on two sensing time points tS1 and tS2. The horizontal axes of the graphs of FIG. 9C indicate time, and the vertical axes indicate the voltage of a sensing node of the page buffer unit 240 of FIG. 3 for sensing bits stored in memory cells. Referring to FIG. 9C, a voltage change of the sensing node in a precharge period and a developing period for reading the previous page data programmed to memory cells is illustrated. The voltage change of the sensing node in the developing period may vary according to a threshold voltage of the memory cell.

The reference read voltage VRD of FIG. 9A may be applied to the selected word line (e.g., the first word line WL1) of FIG. 8 to read the previous page data in a program normal state and a program defective state. In this case, a sensing node voltage may be compared to a reference voltage Vr at the first sensing time point tS1 to read the previous page data based on a first sensing value, and the sensing node voltage may be compared to the reference voltage Vr at the second sensing time point tS2 to read the previous page data based on a second sensing value. When the sensing node voltage is higher than the reference voltage Vr, the memory cell may be identified as a program cell, and when the sensing node voltage is lower than the reference voltage Vr, the memory cell may be identified as an erasure cell. In other words, the first sensing time point tS1 may correspond to the first read voltage VS1 of FIG. 9A, and the second sensing time point tS2 may correspond to the second read voltage VS2.

The first sensing time point tS1 may be faster than a reference sensing time point tRD, and the second sensing time point tS2 may be slower than the reference sensing time point tRD. In other words, the first sensing time point tS1 comes before the reference sensing time point tRD and the second sensing time point tS2 comes after the reference sensing time point tRD. The reference sensing time point tRD may be a sensing time point for reading the previous page data in a general read operation performed based on one sensing value, and may be a previously setting value. However, the inventive concept is not limited thereto, and the first sensing time point tS1 or the second sensing time point tS2 may be the same as the reference sensing time point tRD.

In the program normal state, each of the memory cells may be identified as one of a program cell and an erasure cell. For example, as shown in FIG. 9C, when the sensing node voltage is higher than the reference voltage Vr at the first sensing time point tS1 and the second sensing time point tS2, the memory cell may be identified as the program cell, and when the sensing node voltage is lower than the reference voltage Vr at the first sensing time point tS1 and the second sensing time point tS2, the memory cell may be identified as the erasure cell. In this case, the fail bit number may be calculated as 0.

In a program defective state, each of the memory cells may be identified as one of the program cell, the erasure cell, and a failing cell. For example, as shown in FIG. 9C, when the sensing node voltage is higher than the reference voltage Vr at the first sensing time point tS1 and the second sensing time point tS2, the memory cell may be identified as the program cell, and when the sensing node voltage is lower than the reference voltage Vr at the first sensing time point tS1 and the second sensing time point tS2, the memory cell may be identified as the erasure cell. When the sensing node voltage is higher than the reference voltage Vr at the first sensing time point tS1 and the sensing node voltage is lower than the reference voltage Vr at the second sensing time point tS2, the memory cell may be identified as the failing cell. In this case, the calculated fail bit number may be the number of failing cells.

Figure 10:
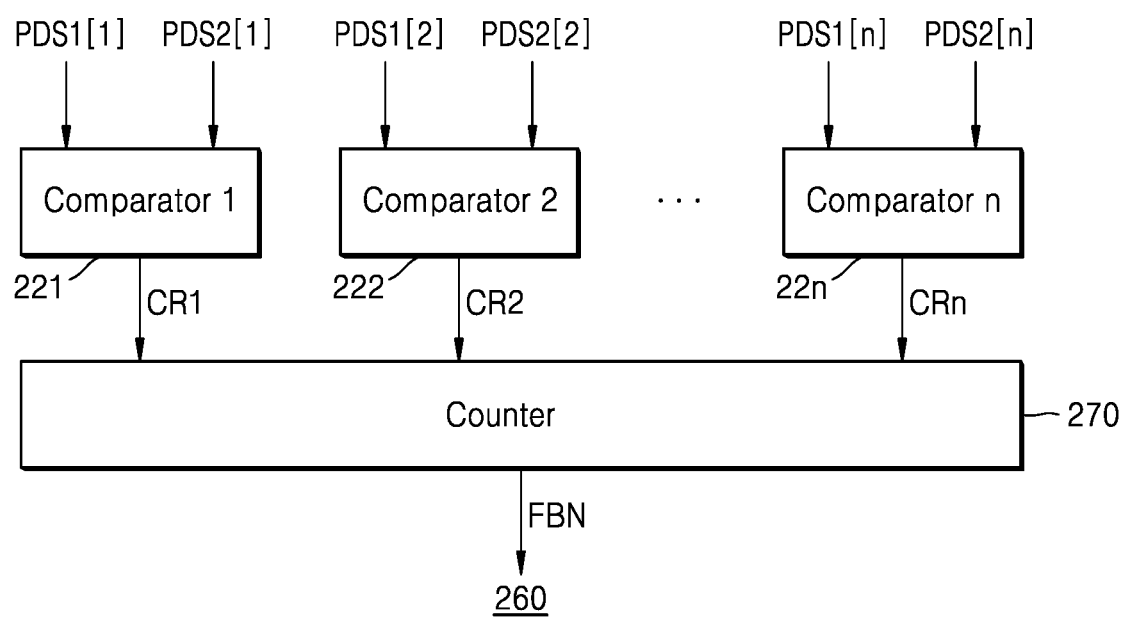
FIG. 10 is a diagram illustrating a fail bit calculator of FIG. 3.

FIG. 10 is a diagram illustrating the fail bit calculator 220 of FIG. 3. Referring to FIG. 10, the fail bit calculator 220 may include first to nth comparators 221 to 22$n$ and a counter 270. The comparators 221 to 22$n$ may receive the first sensing data PDS1 and the second sensing data PDS2 respectively stored in the first latches L1$s$ and the second latches L2$s$ of the page buffers PB1 to PBn of FIG. 8. For example, the first comparator 221 may receive the first bit PDS1[1] of the first sensing data and the first bit PDS2[1] of the second sensing data, and the second comparator 222 and may receive the second bit PDS1[2] of the first sensing data and the second bit PDS2[2] of the second sensing data. Similarly, the n-th comparator 22$n$ may receive an n-th bit PDS1[$n$] of the first sensing data and an n-th bit PDS2[$n$] of the second sensing data.

Each of the comparators 221 to 22$n$ may compare two received bits and output a comparison result. For example, the first comparator 221 may compare the first bit PDS1[1] of the first sensing data to the first bit PDS2[1] of the second sensing data to obtain a first comparison result CR1. The second comparator 222 may compare the second bit PDS1[2] of the first sensing data to the second bit PDS2[2] of the second sensing data and output a second comparison result CR2. Likewise, the n-th comparator 22$n$ may compare the n-th bit PDS1[$n$] of the first sensing data to the n-th bit PDS2[$n$] of the second sensing data to obtain an n-th comparison result CRn. Each of the comparators 221 to 22$n$ may output a first value (e.g., '0') as the comparison result when two bits are the same, and output a second value (e.g., '1') as the comparison result when the two bits are different. For example, each of the comparators 221 to 22$n$ may be implemented as an XOR gate, but the inventive concept is not limited thereto.

The counter 270 may calculate a fail bit number FBN based on the comparison results CR1 to CRn. In an embodiment of the inventive concept, the counter 270 may count a specific value (e.g., '1') indicating that two bits are different among the comparison results CR1 to CRn to calculate the fail bit number FBN. The calculated fail bit number FBN may be provided to the control logic circuit 260. The control logic circuit 260 may perform a multi-page program operation based on the calculated fail bit number FBN.

FIG. 11 is a diagram illustrating an example of the fail bit number FBN calculated according to an operation of the fail bit calculator 220 of FIG. 10. For convenience of explanation, it is assumed that seven memory cells MC11 to MCn1 (e.g., n is 7) are connected to a selected word line (e.g., the first word line WL1) of FIG. 8. Referring to FIGS. 10 and 11, the fail bit calculator 220 may receive the first sensing data PDS1 read from the memory cells MC11 to MC71 based on a first sensing value and the second sensing data PDS2 read from the memory cells MC11 to MC71 based on a second sensing value. For example, as illustrated in FIG. 11, the first sensing data PDS1 may be '0101111' and the second sensing data PDS2 may be '0010111'. In this case, the fail bit calculator 220 may compare the first sensing data PDS1 to the second sensing data PDS2 to obtain '0111000' as the comparison result CR. The fail bit calculator 220 may calculate the fail bit number FBN by counting '1' indicating that two bits read from each of the memory cells MC11 to MC71 are different among the comparison result CR. Accordingly, '3' may be calculated as the fail bit number FBN.

Figure 12:
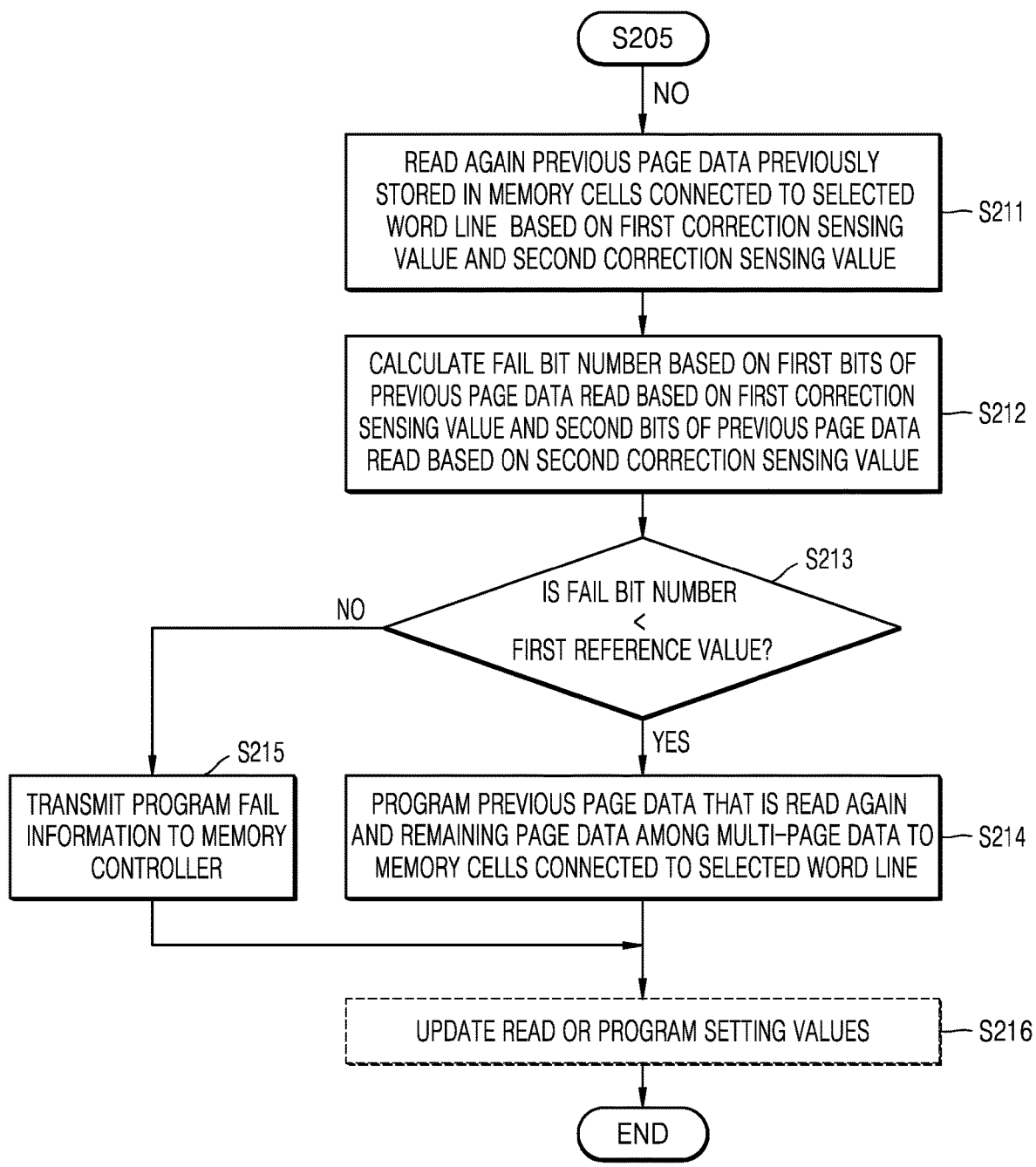
FIG. 12 is a flowchart illustrating an operation of the nonvolatile memory device of FIG. 1 when a fail bit number calculated in FIG. 7 is greater than or equal to a first reference value.

FIG. 12 is a flowchart illustrating an operation of the nonvolatile memory device of FIG. 1 when the fail bit number FBN calculated in FIG. 7 is greater than or equal to a first reference value. Referring to FIGS. 1 and 12, when the calculated fail bit number is greater than or equal to the first reference value, in operation S211, the nonvolatile memory device 200 may read again previous page data previously stored in memory cells connected to a selected word line based on a first correction sensing value and a second correction sensing value. Here, the first correction sensing value and the second correction sensing value may be determined through an algorithm inside the nonvolatile memory device 200 such that the error level of programmed previous page data is more accurately determined. For example, the first correction sensing value may be different from a first sensing value (e.g., the first sensing value used in operation S204), and the second correction sensing value may be different from a second sensing value (e.g., the second sensing value used in operation S204).

In operation S212, the nonvolatile memory device 200 may calculate the fail bit number FBN based on first bits of the previous page data read based on the first correction sensing value and second bits of the previous page data read based on the second correction sensing value. As described with reference to FIGS. 8 to 11, the nonvolatile memory device 200 may calculate the fail bit number FBN corresponding to the previous page data that is read again.

In operation S213, the nonvolatile memory device 200 may determine whether the calculated fail bit number FBN is less than a first reference value. For example, the first reference value may be the same as the first reference value in operation S205, but the inventive concept is not limited thereto. When the calculated fail bit number FBN is less than the first reference value (in other words, when it is determined that the error level of the previous page data that is read again is relatively low), in operation S214, the nonvolatile memory device 200 may program the previous page data that is read again and the remaining page data among the multi-page data to memory cells connected to a selected word line.

When the calculated fail bit number FBN is greater than or equal to the first reference value (in other words, when it is determined that the error level of the previous page data that is read again is relatively high), in operation S215, the nonvolatile memory device 200 may transmit program fail information to the memory controller 100. For example, the nonvolatile memory device 200 may transmit state information indicating a program fail to the memory controller 100 in response to a request for the state information from the memory controller 100.

In operation S216, the nonvolatile memory device 200 may update read or program setting values. For example, the nonvolatile memory device 200 may extract characteristic information of a memory block or a memory die while performing operations S211 to S215 on various word lines (e.g., the first to eighth word lines WL1 to WL8 of FIG. 8) and various memory blocks. The nonvolatile memory device 200 may update a read setting value (e.g., a read voltage, a develop time, or a sensing time point) or a program setting value (e.g., a program voltage or a program verify voltage) based on the extracted characteristic information. For example, the nonvolatile memory device 200 may decrease or increase the read voltage, the develop time, or the sensing time point based on the extracted characteristic information of the memory block or the memory die. The nonvolatile memory device 200 may decrease or increase the program voltage or the program verify voltage based on the extracted characteristic information of the memory block or memory die. Accordingly, as shown in FIG. 5B, the unselected program verify voltage VF01 or a program voltage may change in the unselected program operation PGM_unsel, or the read voltage VRD01 may change in the previous page data read operation RD_pre. In an embodiment of the inventive concept, operation S216 may be omitted.

As described above, when it is determined that the error level of the programmed previous page data is relatively high, the nonvolatile memory device 200 may adjust the two sensing values to read the previous page data again. In other words, the nonvolatile memory device 200 may change read conditions and read the previous page data again to obtain the previous page data again, and may determine an error level with respect to the obtained previous page data.

Figure 13:
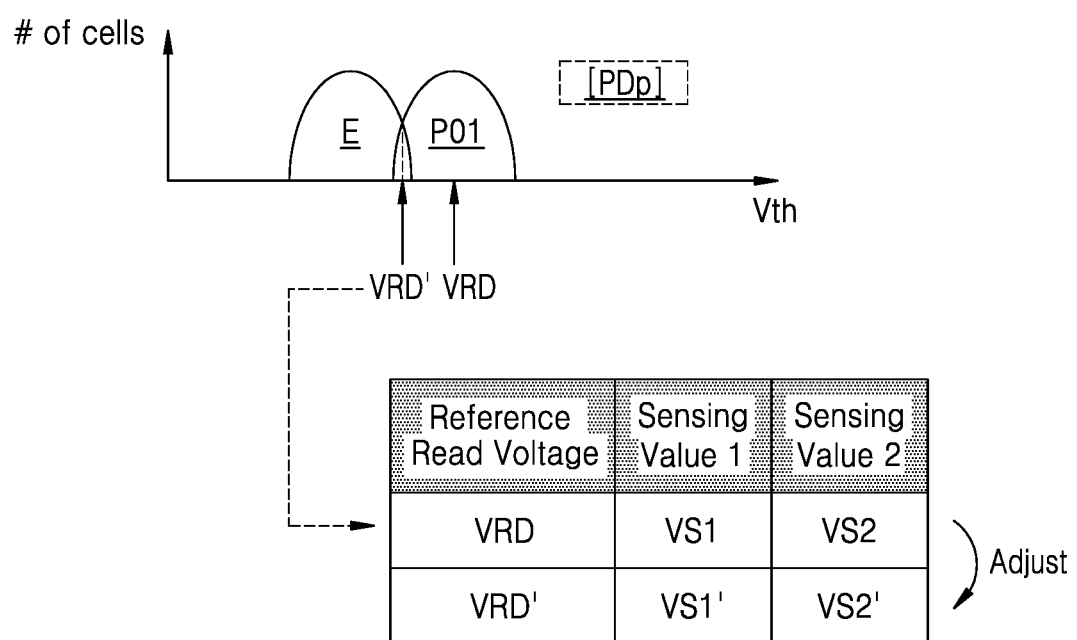
FIG. 13 illustrates an example of adjusting two sensing values according to an operation of the nonvolatile memory device of FIG. 12.

FIG. 13 illustrates an example of adjusting two sensing values according to an operation of the nonvolatile memory device 200 of FIG. 12. In other words, the example of obtaining a first correction sensing value and a second correction sensing value will be described with reference to FIG. 13. Referring to FIG. 13, a dispersion of memory cells (e.g., memory cells connected to a selected word line) in which the previous page data PDp is programmed is illustrated. The horizontal axis of the dispersion indicates a threshold voltage, and the vertical axis indicates the number of memory cells. Each of the memory cells in which the previous page data PDp is programmed may have one of the erasure state E and the program state P01.

To adjust the two sensing values, as described with reference to FIG. 9A, the nonvolatile memory device 200 may adjust the reference read voltage VRD used in a general read operation (e.g., a read operation performed based on one sensing value) and obtain a correction reference read voltage VRD'. For example, the nonvolatile memory device 200 may perform a valley search operation of searching for a valley of a threshold voltage distribution formed by the memory cells and obtain the correction reference read voltage VRD'. As another example, the nonvolatile memory device 200 may adjust the reference read voltage VRD according to program states of memory cells connected to an unselected word line and obtain the correction reference read voltage VRD'. For example, the nonvolatile memory device 200 may increase the reference read voltage VRD and obtain the correction reference read voltage VRD' when the memory cell connected to the unselected word line is in a program state, and may reduce the reference read voltage VRD and obtain the correction reference read voltage VRD' when the memory cell connected to the unselected word line is in an erasure state.

As illustrated in FIG. 13, as the reference read voltage VRD is adjusted, the first sensing value and the second sensing value may be adjusted. For example, as described with reference to FIG. 9A, when a read operation is performed based on two read voltages, the first read voltage VS1 and the second read voltage VS2 corresponding to the reference read voltage VRD may be respectively adjusted to a first correction read voltage VS1' and a second correction read voltage VS2'. For example, when the correction reference read voltage VRD' is lower than the reference read voltage VRD, the first correction read voltage VS1' and the second correction read voltage VS2' may be lower than the first read voltage VS1 and the second read voltage VS2, respectively. As another example, when the correction reference read voltage VRD' is greater than the reference read voltage VRD, the first correction read voltage VS1' and the second correction read voltage VS2' may be greater than the first read voltage VS1 and the second read voltage VS2, respectively.

For example, as described with reference to FIG. 9C, when the read operation is performed based on two sensing time points, the two sensing values may be adjusted as the reference read voltage VRD is adjusted. For example, when the correction reference read voltage VRD' is applied to the selected word line, the first sensing time point tS1 may correspond to the first correction read voltage VS1', and the second sensing time point tS2 may correspond to the second correction read voltage VS2'. However, the inventive concept is not limited thereto, and the reference read voltage VRD may remain unchanged, and the first sensing time point tS1 or the second sensing time point tS2 may be adjusted.

As described above, when the reference read voltage VRD is adjusted to the correction reference read voltage VRD', the fail bit number FBN with respect to the previous page data PDp read based on the two correction sensing values may be reduced. Accordingly, the nonvolatile memory device 200 may perform a multi-page program operation based on previous page data having a reduced error level. Accordingly, reliability with respect to the multi-page program operation may be increased.

Figure 14:
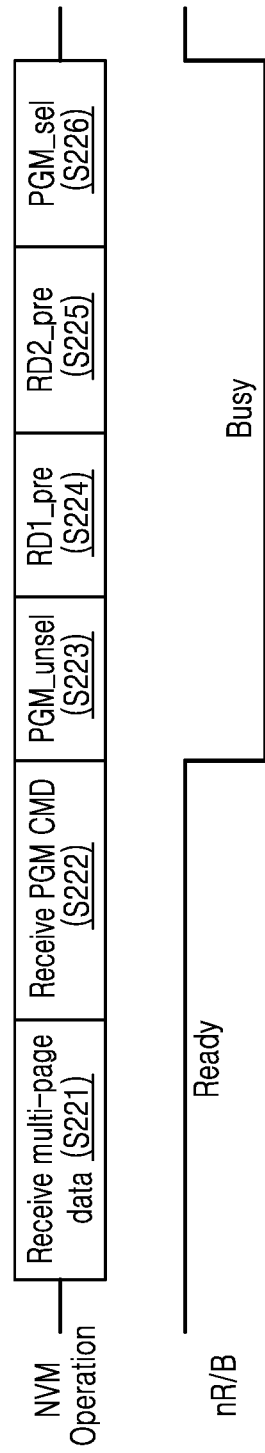
FIG. 14 is a timing diagram illustrating an operation of a nonvolatile memory device according to the flowchart of FIG. 12.

FIG. 14 is a timing diagram illustrating an operation of a nonvolatile memory device according to the flowchart of FIG. 12. Referring to FIGS. 1 and 14, in operation S221, the nonvolatile memory device 200 may receive multi-page data from the memory controller 100. For example, the nonvolatile memory device 200 may receive the multi-page data according to a data input command. In operation S222, the nonvolatile memory device 200 may receive a program command from the memory controller 100. The nonvolatile memory device 200 may perform a program operation on the received multi-page data in response to the program command. For example, the nonvolatile memory device 200 may receive one address to which the multi-page data is to be programmed together with the data input command or the program command from the memory controller 100. However, the inventive concept is not limited to performing operation S222 after operation S221. For example, when a channel through which the command and the address are transmitted and a channel through which data is transmitted and received are separated, operations S221 and S222 may be performed in parallel. As another example, after the program command is first received in operation S222, the multi-page data may be received in operation S221.

The nonvolatile memory device 200 may transmit a ready/busy signal nR/B indicating a ready state (e.g., a high level) to the memory controller 100 while performing operations S221 and S222. In an embodiment of the inventive concept, the nonvolatile memory device 200 may receive a program setup command before receiving the multi-page data, and may receive a program confirm command after receiving the multi-page data.

In operation S223, the nonvolatile memory device 200 may perform the unselected program operation PGM_unsel. For example, the nonvolatile memory device 200 may program one page data among the multi-page data to memory cells connected to an unselected word line. In operation S224, the nonvolatile memory device 200 may perform a first previous page data read operation RD1_pre. For example, the nonvolatile memory device 200 may read previous page data previously stored in memory cells connected to a selected word line based on the first sensing value and the second sensing value. In operation S225, the nonvolatile memory device 200 may perform a second previous page data read operation RD2_pre. For example, the nonvolatile memory device 200 may read the previous page data again based on a first correction sensing value and a second correction sensing value. In this case, as described with reference to FIG. 12, operation S225 may be performed when the fail bit number FBN with respect to the previous page data is greater than or equal to a first reference value. In operation S226, the nonvolatile memory device 200 may perform the selected program operation PGM_sel. For example, the nonvolatile memory device 200 may program the previous read page data that is read again and the remaining page data among the multi-page data to the memory cells connected to the selected word line. The nonvolatile memory device 200 may transmit the ready/busy signal nR/B indicating a busy state (e.g., a low level) to the memory controller 100 while performing operations S223 and S226. In other words, while a multi-page program operation according to an embodiment of the inventive concept is performed (e.g., during one program cycle), the ready/busy signal nR/B may maintain the busy state.

Figure 15:
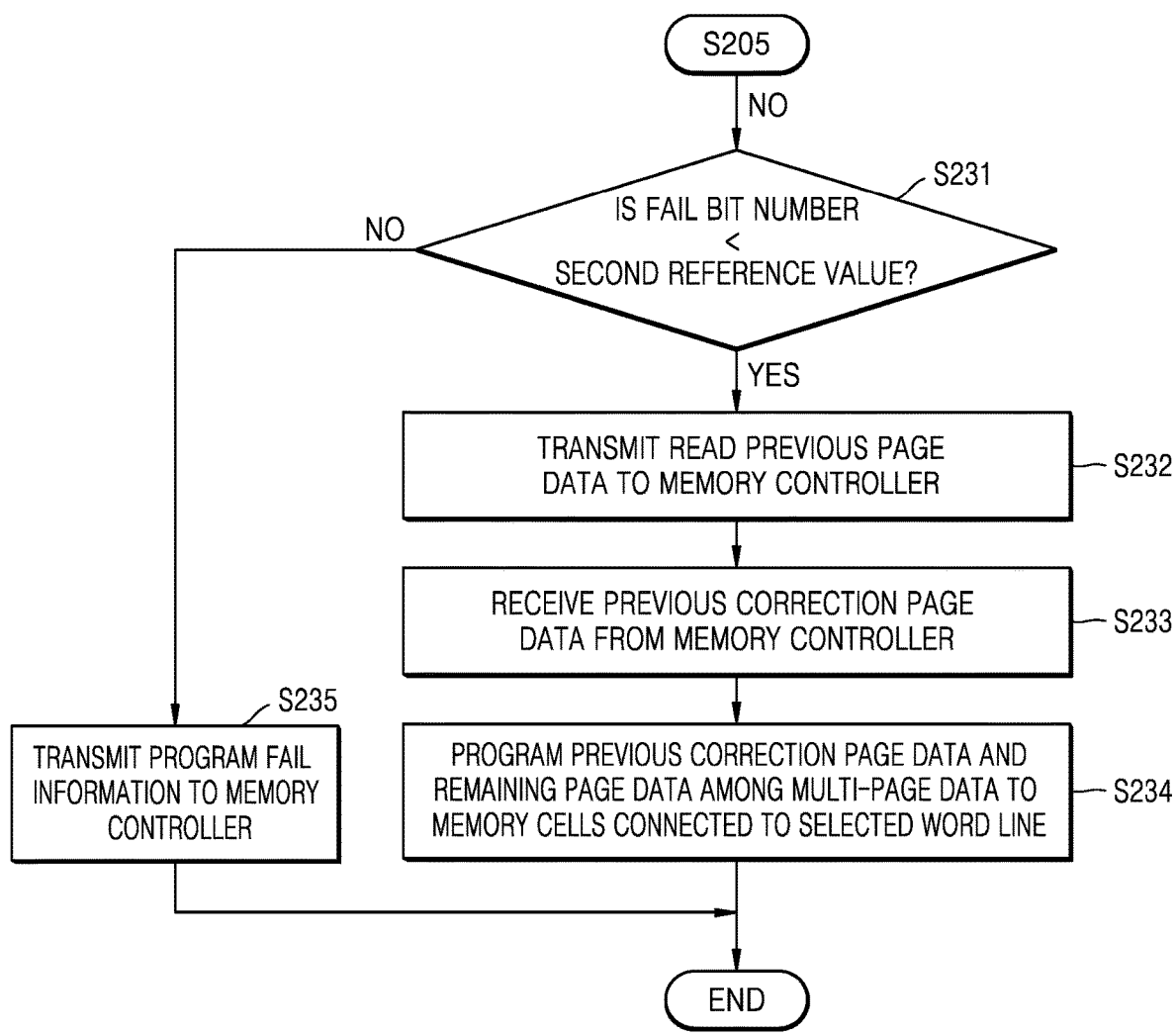
FIG. 15 is a flowchart illustrating an operation of the nonvolatile memory device of FIG. 1 when a fail bit number calculated in FIG. 7 is greater than or equal to a first reference value.

FIG. 15 is a flowchart illustrating an operation of the nonvolatile memory device 200 of FIG. 1 when the fail bit number FBN calculated in FIG. 7 is greater than or equal to a first reference value. Referring to FIGS. 1 and 15, when the calculated fail bit number FBN is greater than or equal to the first reference value, in operation S231, the nonvolatile memory device 200 may then determine whether the fail bit number FBN is less than a second reference value. Here, the second reference value may be a reference value for determining whether to correct an error of previous page data, and may be greater than the first reference value. In other words, in operation S231, the nonvolatile memory device 200 may determine whether the fail bit number FBN has a level at which the error of the previous page data may be corrected.

When the fail bit number FBN is less than the second reference value (in other words, when it is determined to be the level at which the error of the previous page data may be corrected), in operation S232, the nonvolatile memory device 200 may transmit the read previous page data to the memory controller 100. For example, the read previous page data may be data read based on a first sensing value or a second sensing value, as described with reference to FIGS. 9A and 9C. However, the inventive concept is not limited thereto, and the read previous page data may be data read based on the reference read voltage VRD and the reference sensing time point tRD.

In operation S233, the nonvolatile memory device 200 may receive previous correction page data from the memory controller 100. The previous correction page data may be generated by correcting an error of the previous page data transmitted to the memory controller 100. For example, the error of the previous page data transmitted to the memory controller 100 may be corrected by the ECC circuit 130 of FIG. 2.

In operation S234, the nonvolatile memory device 200 may program the previous correction page data and the remaining page data among the multi-page data to memory cells connected to a selected word line. Accordingly, the multi-page program operation may be completed. In another embodiment of the inventive concept, the nonvolatile memory device 200 may program the previous correction page data and the remaining page data among the multi-page data to other memory cells instead of programming the previous correction page data and the remaining page data among the multi-page data to memory cells connected to the selected word line. In this case, the other memory cells may be included in a memory block different from the memory block in which the previous page data is programmed.

When the fail bit number FBN is greater than or equal to the second reference value (in other words, when it is determined to be the level at which the error of the previous page data may not be corrected), in operation S235, the nonvolatile memory device 200 may transmit program fail information to the memory controller 100. For example, the nonvolatile memory device 200 may transmit state information indicating a program fail to the memory controller 100 in response to a request for the state information from the memory controller 100.

As described above, when it is determined that the fail bit number FBN has the level at which the error of the read previous page data may be corrected, the nonvolatile memory device 200 may transmit the previous page data to the memory controller 100 and may correct the error of the previous page data by using the memory controller 100. Accordingly, the multi-page program operation may be performed based on the error-corrected previous page data (e.g., previous correction page data), and the reliability of the programmed multi-page data may be increased according to the multi-page program operation. However, the inventive concept is not limited thereto, and the error of the read previous page data may be corrected inside the nonvolatile memory device 200.

In an embodiment of the inventive concept, operations S231 to S235 may be performed when it is determined that the fail bit number FBN is greater than or equal to the first reference value in operation S213 of FIG. 12. In other words, when the error level of the previous read page data that is read again is not reduced according to read conditions (e.g., the read voltage and the sensing time point) changed inside the nonvolatile memory device 200 (in other words, when the fail bit number FBN of the previous page data is greater than or equal to the first reference value), the error of the previous page data may be corrected by the memory controller 100.

Figure 16:
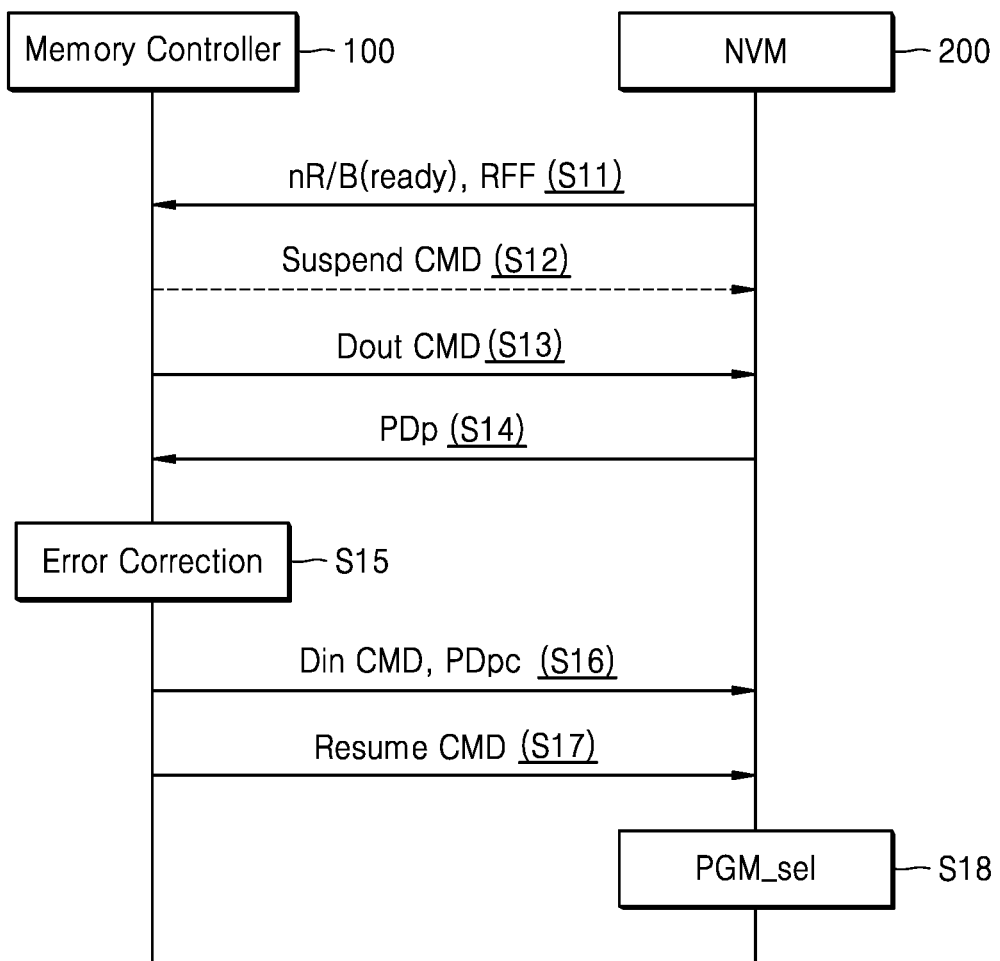
FIG. 16 is a flowchart illustrating an operation of the memory system of FIG. 1 according to the flowchart of FIG. 15.

FIG. 16 is a flowchart illustrating an operation of the memory system of FIG. 1 according to the flowchart of FIG. 15. More specifically, FIG. 16 illustrates operations of the memory controller 100 and the nonvolatile memory device 200 when the number of fail bits is less than a second reference value. Referring to FIG. 16, when the fail bit number FBN is less than a second reference value, in operation S11, the nonvolatile memory device 200 may transmit the ready/busy signal nR/B indicating a ready state and a read fail flag RFF indicating a read fail to the memory controller 100. For example, the nonvolatile memory device 200 may transmit the read fail flag RFF to the memory controller 100 in response to a state information request of the memory controller 100, but the inventive concept is not limited thereto.

In operation S12, the memory controller 100 may transmit a suspend command Suspend CMD to the nonvolatile memory device 200 according to the ready/busy signal nR/B and the read fail flag RFF of the nonvolatile memory device 200. In operation S13, the memory controller 100 may transmit a data output command Dout CMD for outputting the previous page data PDp to the nonvolatile memory device 200. In operation S14, the nonvolatile memory device 200 may transmit the previous page data PDp to the memory controller 100 in response to the data output command Dout CMD.

In operation S15, the memory controller 100 may correct an error of the previous page data PDp of the nonvolatile memory device 200. Accordingly, previous correction page data PDpc may be generated. In operation S16, the memory controller 100 may transmit the previous correction page data PDpc to the nonvolatile memory device 200 together with a data input command Din CMD. In operation S17, the memory controller 100 may transmit a resume command Resume CMD to the nonvolatile memory device 200. In operation S18, the nonvolatile memory device 200 may perform the selected program operation PGM_sel based on the previous correction page data PDpc, as described with reference to FIG. 15, in response to the resume command Resume CMD. Accordingly, the multi-page program operation may be completed.

In an embodiment of the inventive concept, operation S12 of transmitting the suspend command Suspend CMD may be omitted. In this case, the memory controller 100 may transmit the data output command Dout CMD to the nonvolatile memory device 200 according to the ready/busy signal nR/B and the read fail flag RFF of the nonvolatile memory device 200.

Figure 17:
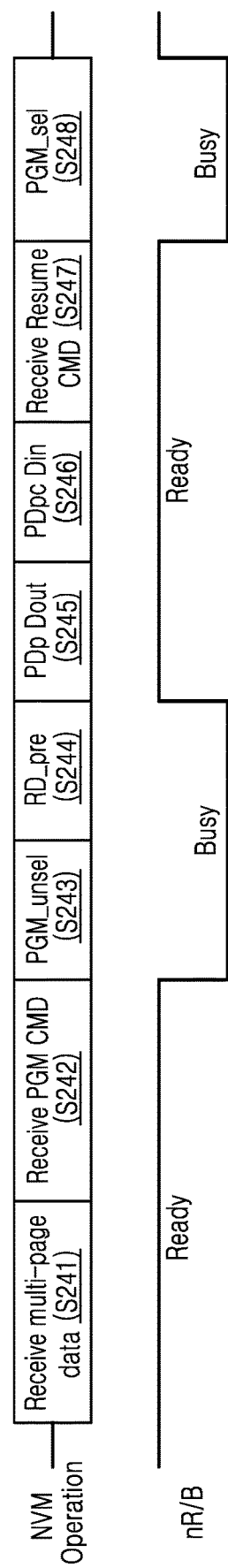
FIG. 17 is a timing diagram illustrating an operation of a nonvolatile memory device according to the flowcharts of FIGS. 15 and 16.

FIG. 17 is a timing diagram illustrating an operation of a nonvolatile memory device according to the flowcharts of FIGS. 15 and 16. Referring to FIGS. 1, 16, and 17, operations S241 to S244 may respectively correspond to operations S221 to S224 of FIG. 14, and thus redundant descriptions will be omitted below.

In operation S245, the nonvolatile memory device 200 may output the read previous page data PDp. The output previous page data PDp may be transmitted to the memory controller 100. For example, the nonvolatile memory device 200 may transmit the previous page data PDp stored in the page buffer unit 240 of FIG. 3 to the memory controller 100 in response to a data output command from the memory controller 100.

In operation S246, the nonvolatile memory device 200 may receive the previous correction page data PDpc from the memory controller 100. For example, the nonvolatile memory device 200 may store the previous correction page data PDpc in the page buffer unit 240 in response to a data input command Din from the memory controller 100. In operation S247, the nonvolatile memory device 200 may receive the resume command Resume CMD from the memory controller 100. While operations S245 to S247 are performed, the ready/busy signal nR/B may be in a ready state. For example, the ready/busy signal nR/B may have a high level.

In operation S248, the nonvolatile memory device 200 may perform the selected program operation PGM_sel. For example, the nonvolatile memory device 200 may program the previous correction page data PDpc and the remaining page data among the multi-page data to memory cells connected to a selected word line. While operation S248 is performed, the ready/busy signal nR/B may be in a busy state. For example, the ready/busy signal nR/B may have a low level. After operation S248, the ready/busy signal nR/B may change to a ready state.

As described above, when the memory controller 100 performs error correction on the previous page data PDp, the ready/busy signal nR/B output from the nonvolatile memory device 200 in one program cycle may change back to the busy state after changing from the busy state to the ready state.

Figure 18A:
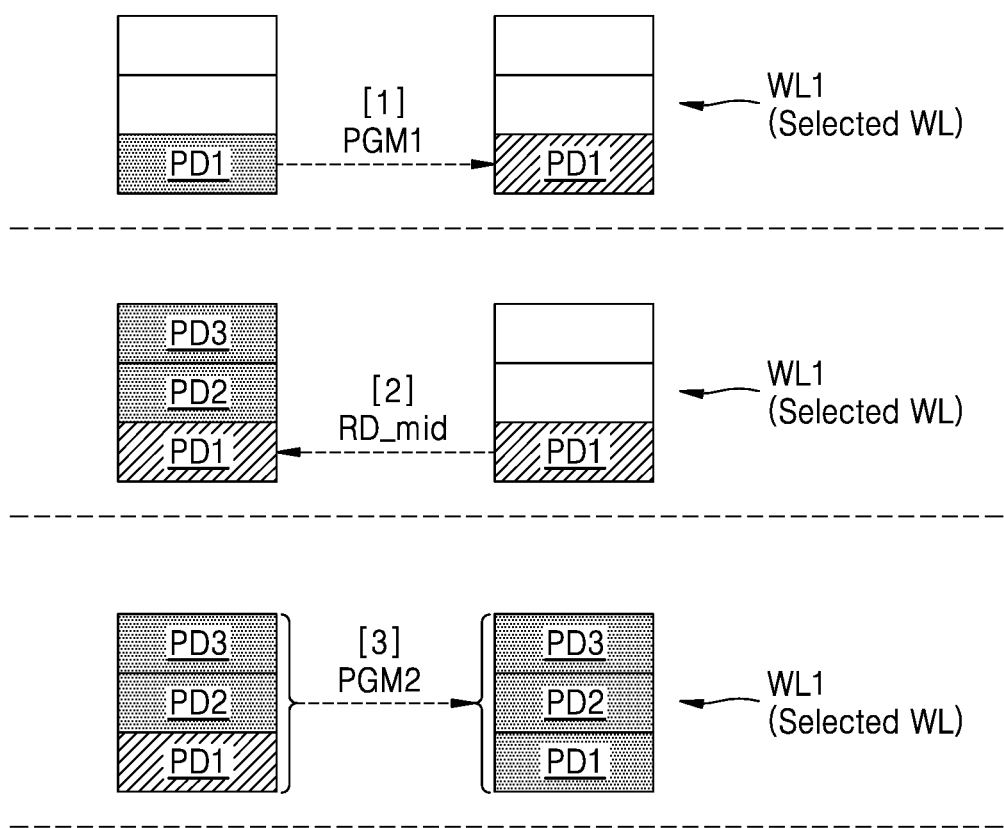
FIGS. 18A and 18B are diagrams illustrating a program technique with respect to multi-page data according to an embodiment of the inventive concept.
Figure 18B:
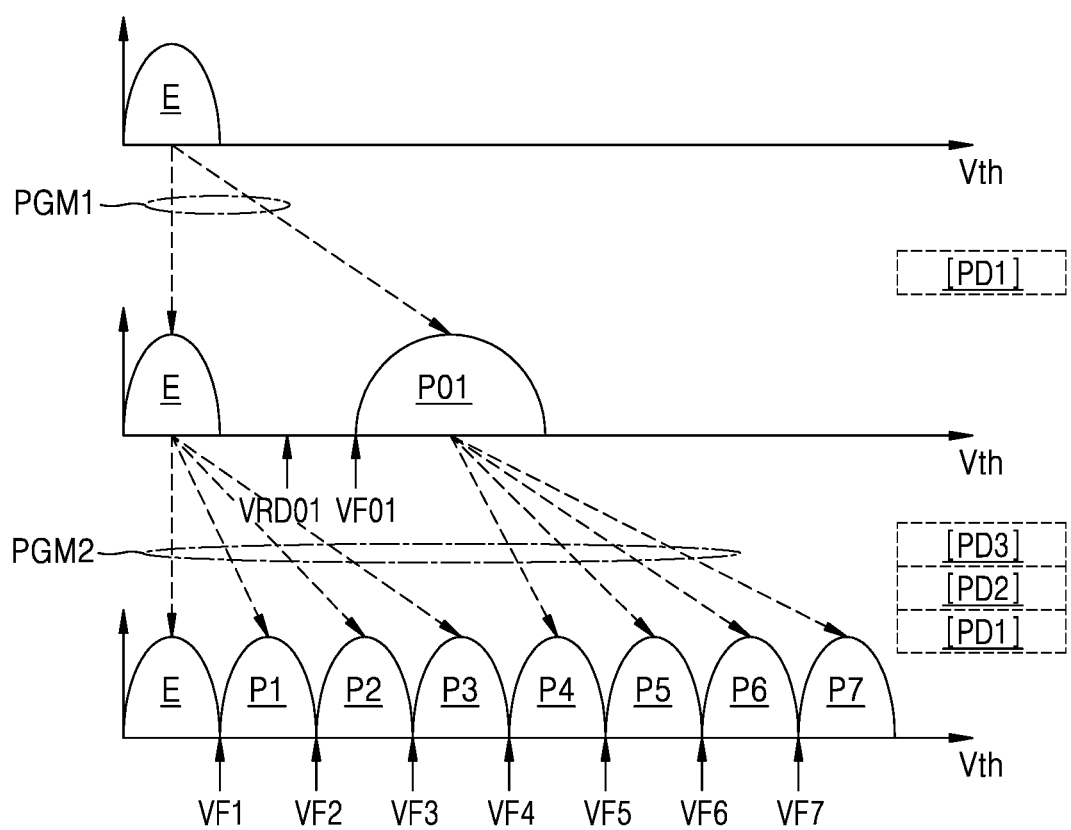

FIGS. 18A and 18B are diagrams illustrating a program technique with respect to multi-page data according to an embodiment of the inventive concept. The operations of FIGS. 18A and 18B may be performed in one program cycle for a multi-page program operation. The horizontal axes of dispersions shown in FIG. 18B indicate threshold voltages of memory cells, and the vertical axes indicate the number of memory cells.

Referring to FIGS. 3, 18A, and 18B, the nonvolatile memory device 200 may receive the first page data PD1. In an embodiment of the inventive concept, the received first page data PD1 may be stored in the page buffer unit 240 of the nonvolatile memory device 200.

The nonvolatile memory device 200 may program the first page data PD1 to memory cells connected to the first word line WL1, which is a selected word line (hereinafter this programming is referred to as a first program operation PGM1). As shown in FIG. 18B, the nonvolatile memory device 200 may perform the first program operation PGM1 such that the memory cells connected to the first word line WL1 are in any one of the erasure state E and the program state P01. In the first program operation PGM1, the program verify voltage VF01 may be used to verify the program state P01. When the first program operation PGM1 on the first word line WL1 is completed, the memory cells connected to the first word line WL1 may be in a state in which the first page data PD1 is stored.

After the first program operation PGM1, the nonvolatile memory device 200 may receive the remaining page data (e.g., the second page data PD2 and the third page data PD3) among the multi-page data. In an embodiment of the inventive concept, the received second and third page data PD2 and PD3 may be stored in the page buffer unit 240 of the nonvolatile memory device 200.

After the remaining page data PD2 and PD3 is received, the nonvolatile memory device 200 may read the first page data PD1 from the memory cells connected to the first word line WL1 (hereinafter this read operation is referred to as a middle read operation RD_mid). As shown in FIG. 18B, each of the memory cells in which the first page data PD1 is stored may be in any one of the erasure state E and the program state P01. The nonvolatile memory device 200 may perform the middle read operation RD_mid using the read voltage VRD01, thereby reading the first page data PD1.

After the middle read operation RD_mid, the nonvolatile memory device 200 may perform a program operation (hereinafter this program operation is referred to as a second program operation PGM2) on the memory cells connected to the first word line WL1 based on the second page data PD2, the third page data PD3, and the read first page data PD1. As shown in FIG. 18B, as the nonvolatile memory device 200 performs the second program operation PGM2, the memory cells in the erase state E among the memory cells connected to the first word line WL1 may be in any one of the erase state E and the first to third program states P1 to P3 and the memory cells in the program state P01 may be in any one of the fourth to seventh program states P4 to P7. In the second program operation PGM2, the first to seventh program verification voltages VF1 to VF7 may be used to verify the first to seventh program states P1 to P7. When the second program operation PGM2 is completed, the memory cells connected to the first word line WL1 may store the first to third page data PD1 to PD3.

In FIGS. 18A and 18B, it is described that one page data (e.g., the first page data PD1) is programmed in the first program operation PGM1, and the remaining page data (e.g., the second and third page data PD2 and PD3) is programmed in the second program operation PGM2, but the inventive concept is not limited thereto. For example, two page data (e.g., the first page data PD1 and second page data PD2) may be programmed in the first program operation PGM1, and the remaining data (e.g., the third page data PD3) may be programmed in the second program operation PGM2. Alternatively, one page data (e.g., the first page data PD1) may be programmed in the first program operation PGM1, one page data (e.g., the second page data PD2) may be programmed in the second program operation PGM2, and the remaining page data (e.g., the third page data PD3) may be programmed in an additional program operation.

As described above, the multi-page program operation according to an embodiment of the inventive concept may program at least one page data of the multi-page data to the memory cells connected to the selected word line and then program the remaining page data to the memory cells connected to the selected word line (in other words, the second program operation PGM2 is performed after the first program operation PGM1). In this case, at least one page data stored in the memory cells connected to the selected word line may be read, and the second program operation PGM2 may be performed based on the read at least one page data and the remaining page data. According to such a program technique, the reliability of page data programmed through the second program operation PGM2 may be reduced due to an error level occurring during the first program operation PGM1.

Hereinafter, multi-page program operations for increasing the reliability of the program technique of FIGS. 18A and 18B will be described in detail with reference to FIGS. 19 to 23. For convenience of description, as shown in FIGS. 18A and 18B, the multi-page program operations will be described based on an embodiment in which the first program operation PGM1 is performed on one page data.

Figure 19:
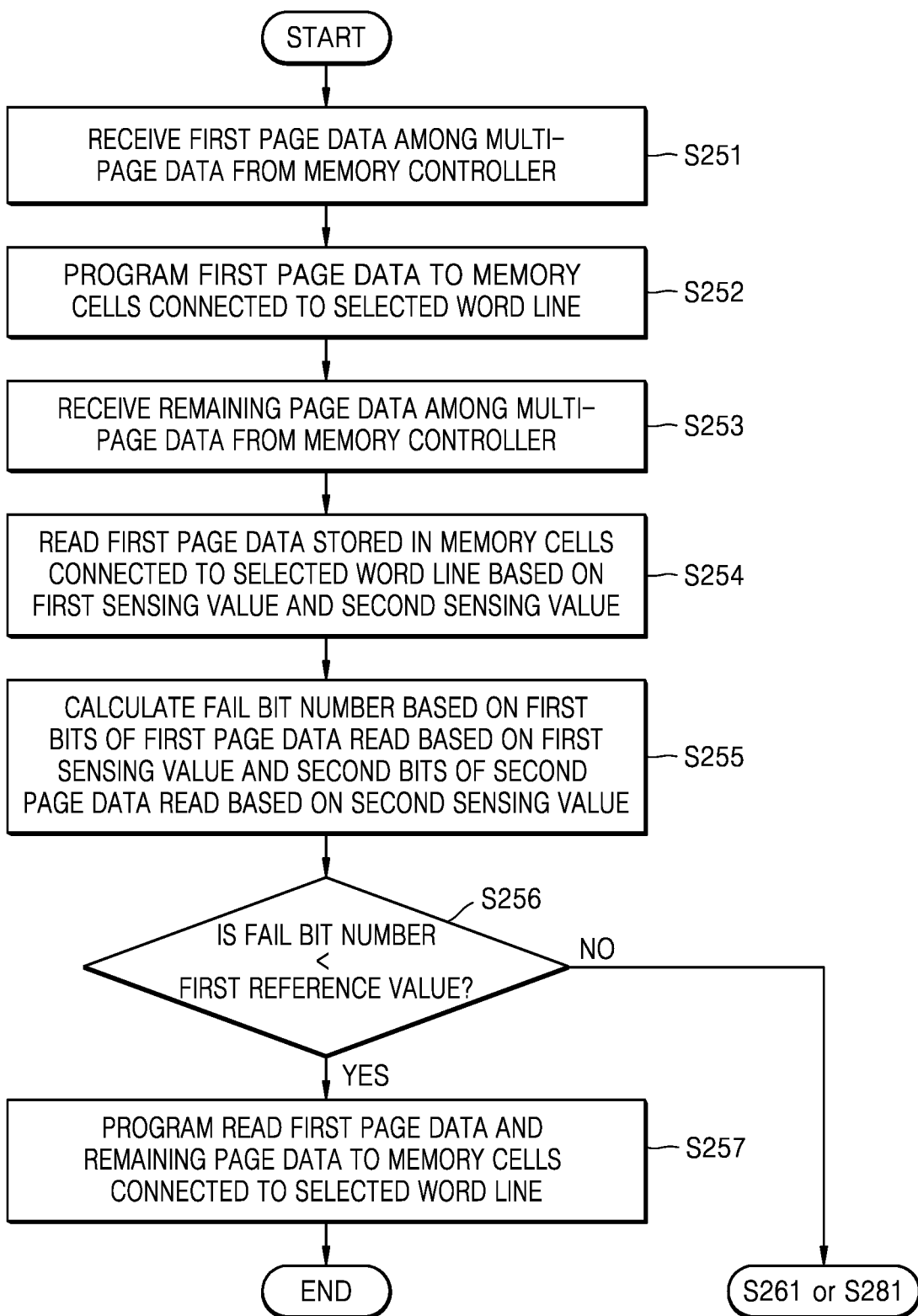
FIG. 19 is a flowchart illustrating a program operation of the nonvolatile memory device of FIG. 1 on multi-page data according to the program technique of FIGS. 18A and 18B.

FIG. 19 is a flowchart illustrating a program operation of the nonvolatile memory device 200 of FIG. 1 on multi-page data according to the program technique of FIGS. 18A and 18B. Referring to FIGS. 1, 3, and 19, in operation S251, the nonvolatile memory device 200 may receive first page data among the multi-page data from the memory controller 100. For example, the nonvolatile memory device 200 may further receive the address ADDR corresponding to a selected word line and the program command CMD with respect to the first page data together with the first page data from the memory controller 100.

In operation S252, the nonvolatile memory device 200 may program the first page data to memory cells connected to the selected word line.

In operation S253, the nonvolatile memory device 200 may receive the remaining page data among the multi-page data from the memory controller 100. For example, the nonvolatile memory device 200 may further receive the address ADDR corresponding to the selected word line and the program command CMD on the remaining page data along with the remaining page data from the memory controller 100.

In operation S254, the nonvolatile memory device 200 may read the first page data stored in the memory cells connected to the selected word line based on a first sensing value and a second sensing value. For example, as described with reference to FIGS. 8 to 9C, the nonvolatile memory device 200 may read the first page data based on first and second read voltages or may read the first page data based on first and second sensing time points.

In operation S255, the nonvolatile memory device 200 may calculate the fail bit number based on first bits of the first page data (e.g., first sensing data) read based on the first sensing value and second bits of the second page data (e.g., second sensing data) read based on the second sensing value. For example, as described with reference to FIGS. 10 and 11, the nonvolatile memory device 200 may compare the first bits to the second bits through the fail bit calculator 220 to identify the number of different bits and calculate the number of the identified different bits as the fail bit number.

In operation S256, the nonvolatile memory device 200 may determine whether the fail bit number is less than a first reference value. When the fail bit number is less than the first reference value (in other words, when it is determined that an error level of programmed first page data is low), in operation S257, the nonvolatile memory device 200 may program the read first page data and the remaining page data to the memory cells connected to the selected word line. For example, the read first page data may be data read based on the first sensing value or the second sensing value. As another example, the read first page data may be data read based on a read voltage of a previously set level (e.g., the reference read voltage VRD of FIG. 9A).

When the fail bit number is greater than or equal to the first reference value (e.g., it is determined that the error level of the programmed first page data is not low), the nonvolatile memory device 200 may perform operation S261 or operation S281. Operation S261 will be described later with reference to FIG. 20, and operation S281 will be described later with reference to FIG. 22. For example, the nonvolatile memory device 200 may process the multi-page program operation as a fail, read the first page data again based on other sensing values, or correct an error of the read first page data.

Figure 20:
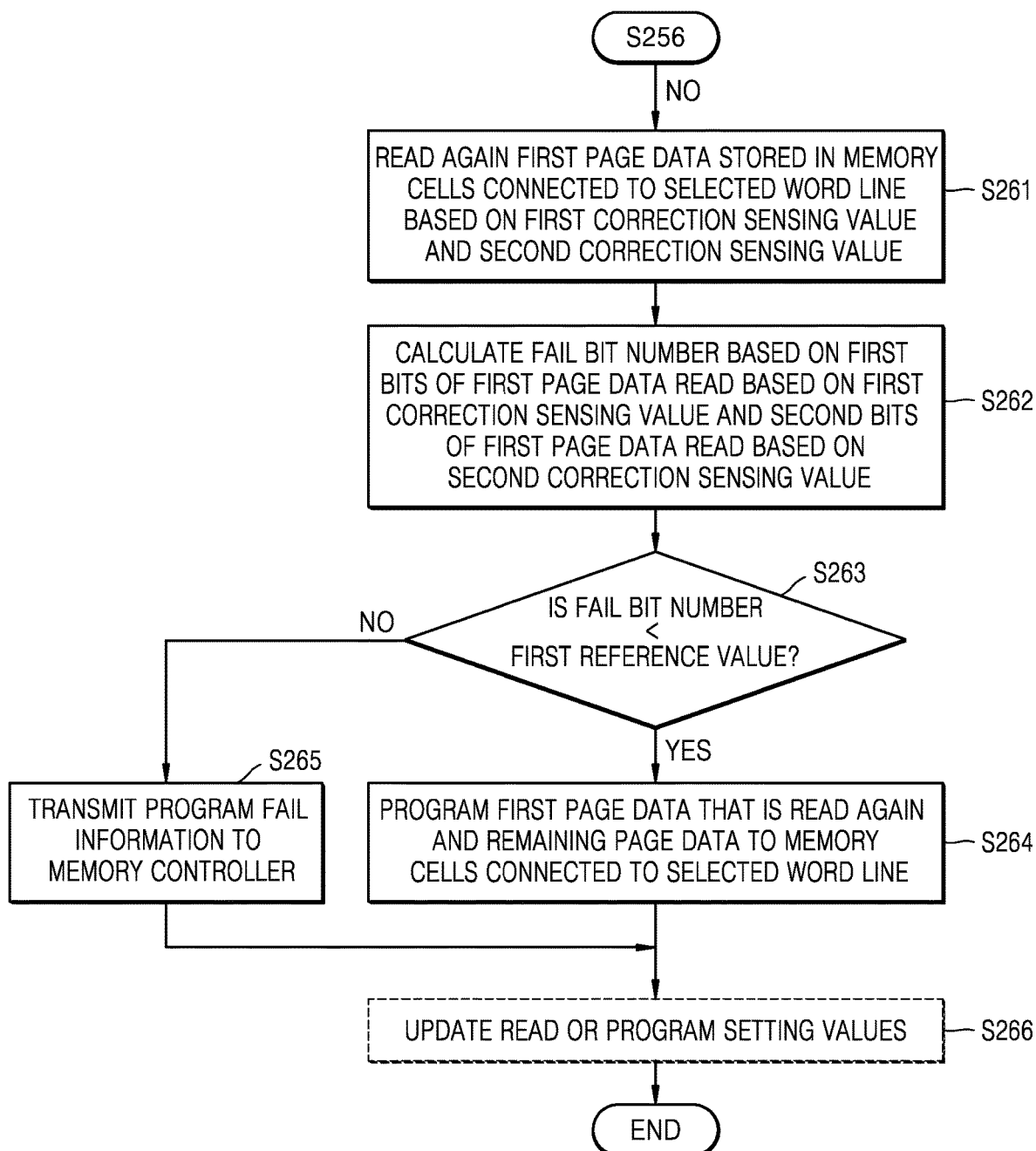
FIG. 20 is a flowchart illustrating an operation of the nonvolatile memory device of FIG. 1 when a fail bit number calculated in FIG. 19 is greater than or equal to a first reference value.

FIG. 20 is a flowchart illustrating an operation of the nonvolatile memory device 200 of FIG. 1 when the fail bit number calculated in FIG. 19 is greater than or equal to a first reference value. Operations S261 to S266 of FIG. 20 respectively correspond to operations S211 to S216 of FIG. 12, and thus detailed descriptions thereof may be omitted below.

Referring to FIGS. 1 and 20, as described with reference to FIG. 19, when the calculated fail bit number is greater than or equal to the first reference value, in operation S261, the nonvolatile memory device 200 may read again first page data stored in memory cells connected to a selected word line based on a first correction sensing value and a second correction sensing value. In operation S262, the nonvolatile memory device 200 may calculate the fail bit number based on first bits of the first page data read based on the first correction sensing value and second bits of the first page data read based on the second correction sensing value.

In operation S263, the nonvolatile memory device 200 may determine whether the calculated fail bit number is less than the first reference value. When the calculated fail bit number is less than the first reference value (in other words, when it is determined that an error level of the first page data that is read again is relatively low), in operation S264, the nonvolatile memory device 200 may program the first page data that is read again and the remaining page data to the memory cells connected to the selected word line. When the calculated fail bit number is greater than or equal to the first reference value (in other words, when it is determined that the error level of the first page data that is read again is relatively high), in operation S265, the nonvolatile memory device 200 may transmit program fail information to the memory controller 100.

In operation S266, the nonvolatile memory device 200 may update read or program setting values. For example, the nonvolatile memory device 200 may extract characteristic information of a memory block or a memory die while performing operations S261 to S265 and update a read setting value (e.g., a read voltage) or a program setting value (e.g., a program voltage or a program verify voltage) based on the extracted characteristic information. In an embodiment of the inventive concept, operation S266 may be omitted.

As described above, when it is determined that the error level of the programmed first page data is relatively high, the nonvolatile memory device 200 may adjust the two sensing values to read the first page data again. In other words, the nonvolatile memory device 200 may change read conditions and read the first page data again to perform a multi-page program operation based on the first page data having a reduced error level. Accordingly, the reliability of the multi-page program operation may be increased.

Figure 21:
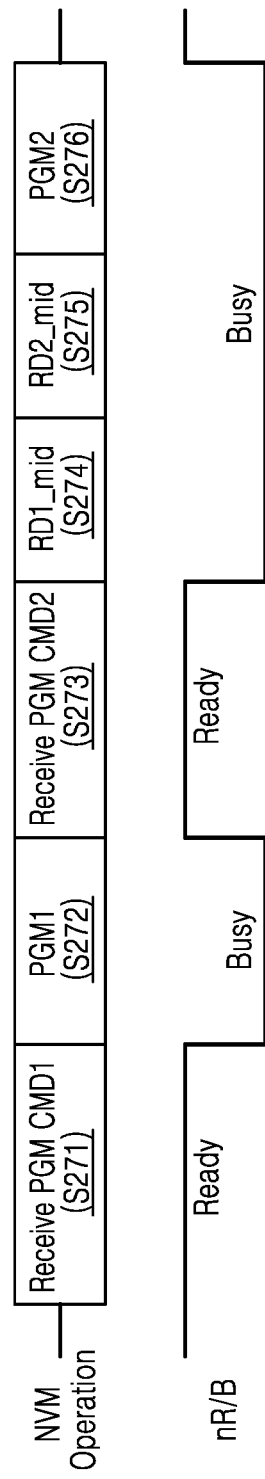
FIG. 21 is a timing diagram illustrating an operation of a nonvolatile memory device according to the flowchart of FIG. 20.

FIG. 21 is a timing diagram illustrating an operation of the nonvolatile memory device 200 according to the flowchart of FIG. 20. Referring to FIGS. 1 and 21, in operation S271, the nonvolatile memory device 200 may receive a first program command PGM CMD1 from the memory controller 100. The first program command PGM CMD1 may be a program command with respect to first page data. Accordingly, the nonvolatile memory device 200 may receive the first page data together with the first program command PGM CMD1. The nonvolatile memory device 200 may receive a first address in which the first page data is to be programmed together with the first program command PGM CMD1. In operation S271, the ready/busy signal nR/B may indicate a ready state.

In operation S272, the nonvolatile memory device 200 may perform a first program operation PGM1 on the first page data in response to the first program command PGM CMD1. In operation S272, the ready/busy signal nR/B may indicate a busy state. In operation S273, the nonvolatile memory device 200 may receive a second program command PGM CMD2 from the memory controller 100. The second program command PGM CMD2 may be a program command with respect to the remaining page data among multi-page data. Accordingly, the nonvolatile memory device 200 may receive the remaining page data together with the second program command PGM CMD2. The nonvolatile memory device 200 may receive a second address in which the remaining page data is to be programmed together with the second program command PGM CMD2. In this case, the second address may be different from the first address. In operation S273, the ready/busy signal nR/B may indicate the ready state.

In operation S274, the nonvolatile memory device 200 may perform a first middle read operation RD1_mid. For example, the nonvolatile memory device 200 may read the first page data stored in memory cells connected to a selected word line based on a first sensing value and a second sensing value. In operation S275, the nonvolatile memory device 200 may perform a second middle read operation RD2_mid. For example, the nonvolatile memory device 200 may read the first page data again based on a first correction sensing value and a second correction sensing value. In this case, as described with reference to FIG. 20, operation S275 may be performed when the fail bit number with respect to the first page data is greater than or equal to a first reference value.

In operation S276, the nonvolatile memory device 200 may perform a second program operation PGM2 on the remaining page data. For example, the nonvolatile memory device 200 may program the first page data that is read again and the remaining page data to the memory cells connected to the selected word line.

The nonvolatile memory device 200 may transmit the ready/busy signal nR/B indicating the ready state to the memory controller 100 while performing operations S271 and S273, and transmit the ready/busy signal nR/B indicating the busy state to the memory controller 100 while performing operations S272 and S274 to S276.

Figure 22:
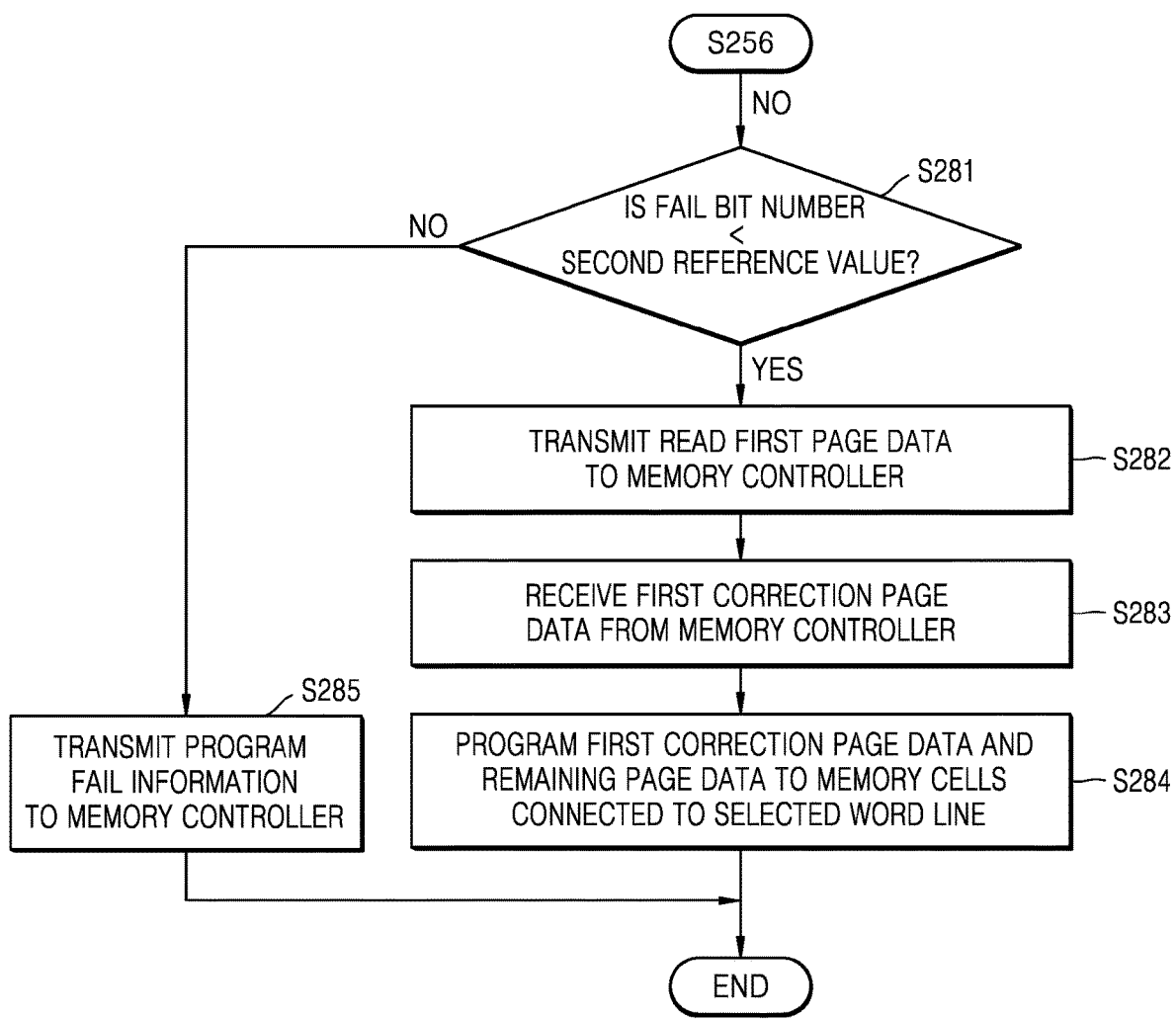
FIG. 22 is a flowchart illustrating an operation of the nonvolatile memory device of FIG. 1 when the fail bit number calculated in FIG. 19 is greater than or equal to a first reference value.

FIG. 22 is a flowchart illustrating an operation of the nonvolatile memory device of FIG. 1 when the fail bit number calculated in FIG. 19 is greater than or equal to a first reference value. Operations S281 to S285 of FIG. 22 respectively correspond to operations S231 to S235 of FIG. 15, and thus detailed descriptions thereof may be omitted below.

Referring to FIGS. 1 and 22, when the calculated fail bit number is greater than or equal to the first reference value, in operation S281, the nonvolatile memory device 200 may determine whether the fail bit number is less than a second reference value. Here, the second reference value may be a reference value for determining whether to correct an error of first page data, and may be greater than the first reference value.

When the fail bit number is less than the second reference value (in other words, when it is determined to be the level at which the error of the first page data may be corrected), in operation S282, the nonvolatile memory device 200 may transmit the read first page data to the memory controller 100. In operation S283, the nonvolatile memory device 200 may receive first correction page data from the memory controller 100. The first correction page data may be generated by correcting an error of the first page data transmitted to the memory controller 100. In operation S284, the nonvolatile memory device 200 may program the first correction page data and the remaining page data to memory cells connected to a selected word line. Accordingly, a multi-page program operation may be completed.

When the fail bit number is greater than or equal to the second reference value (in other words, when it is determined to be the level at which the error of the first page data may not be corrected), in operation S285, the nonvolatile memory device 200 may transmit program fail information to the memory controller 100.

As described above, when it is determined that the fail bit number has the level at which the error of the read first page data may be corrected, the nonvolatile memory device 200 may transmit the first page data to the memory controller 100 and may correct the error of the first page data by using the memory controller 100. Accordingly, the multi-page program operation may be performed based on the error-corrected first page data (e.g., the first correction page data), and the reliability of the programmed multi-page data may be increased according to the multi-page program operation. However, the inventive concept is not limited thereto, and the error of the read first page data may be corrected inside the nonvolatile memory device 200.

In an embodiment of the inventive concept, operations S281 to S285 may be performed when it is determined that the fail bit number is greater than or equal to the first reference value in operation S263 of FIG. 20. In other words, when the error level of the read first page data is not reduced according to read conditions (e.g., the read voltage and the sensing time point) changed inside the nonvolatile memory device 200 (in other words, when the fail bit number of the first page data is greater than or equal to the first reference value), the error of the read first page data may be corrected by the memory controller 100.

Figure 23:
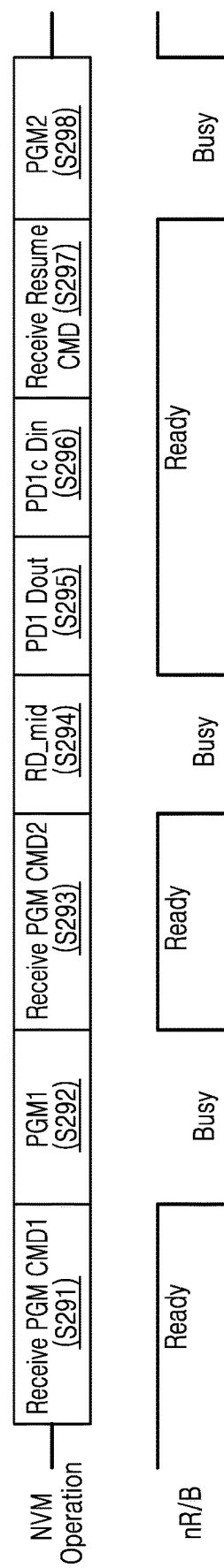
FIG. 23 is a timing diagram illustrating an operation of a nonvolatile memory device according to the flowcharts of FIGS. 19 and 22.

FIG. 23 is a timing diagram illustrating an operation of a nonvolatile memory device according to the flowcharts of FIGS. 19 and 22. Referring to FIGS. 1 and 23, operations S291 to S294 may respectively correspond to operations S271 to S274 of FIG. 21, and thus redundant descriptions will be omitted below.

In operation S295, the nonvolatile memory device 200 may output the read first page data PD1. The output first page data PD1 may be transmitted to the memory controller 100. For example, when the fail bit number of the read first page data PD1 is less than a second reference value in operation S294, as described with reference to FIG. 16, the nonvolatile memory device 200 may transmit the ready/busy signal nR/B indicating a ready state and the read fail flag RFF indicating a read fail to the memory controller 100. The memory controller 100 may transmit a data output Dout command to the nonvolatile memory device 200 in response to the ready/busy signal nR/B and the read fail flag RFF of the nonvolatile memory device 200. The nonvolatile memory device 200 may transmit the first page data PD1 stored in the page buffer unit 240 to the memory controller 100 in response to the data output Dout command of the memory controller 100.

In operation S296, the nonvolatile memory device 200 may receive first correction page data PD1c from the memory controller 100. For example, as described with reference to FIG. 16, the nonvolatile memory device 200 may store the first correction page data PD1c to the page buffer unit 240 in response to a data input Din command of the memory controller 100. In operation S297, the nonvolatile memory device 200 may receive the resume command Resume CMD from the memory controller 100. While operations S295 to S297 are performed, the ready/busy signal nR/B may be in a ready state. In other words, the ready/busy signal nR/B is maintained in the ready state for these three operations.

In operation S298, the nonvolatile memory device 200 may perform the second program operation PGM2. For example, the nonvolatile memory device 200 may program the first correction page data PD1c and the remaining page data to memory cells connected to a selected word line. While operation S298 is performed, the ready/busy signal nR/B may be in a busy state. After operation S298, the ready/busy signal nR/B may change to a ready state.

Figure 24:
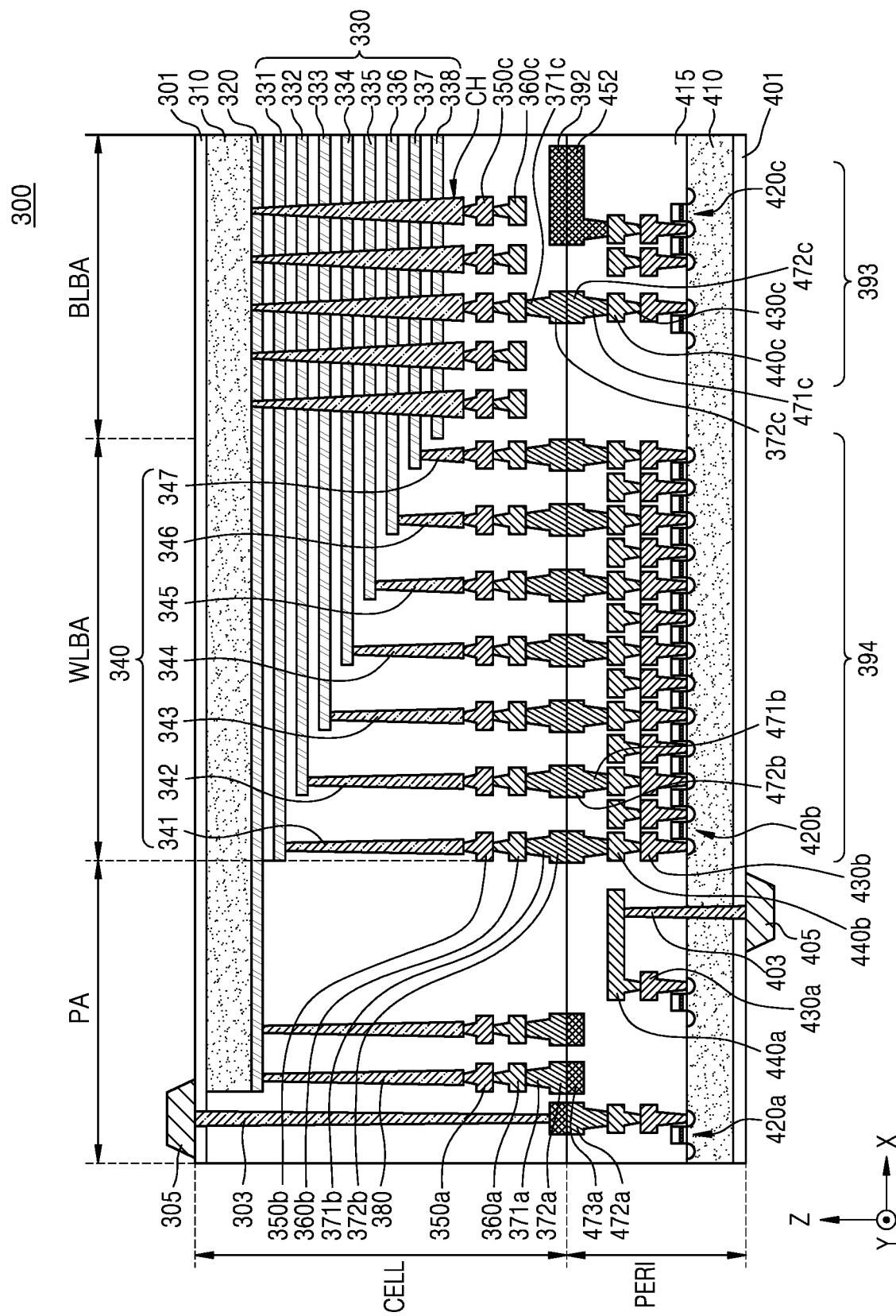
FIG. 24 is a cross-sectional view of a memory device according to an embodiment of the inventive concept.

FIG. 24 is a cross-sectional view of a memory device 300 according to an embodiment of the inventive concept. Referring to FIG. 24, the memory device 300 may have a chip to chip (C2C) structure. The C2C structure may be formed by a process in which an upper chip including a cell area CELL is manufactured on a first wafer, and a lower chip including a peripheral circuit area PERI is manufactured on a second wafer different from the first wafer, and then the upper chip and the lower chip are connected to each other by using a bonding method. The bonding method may be a method of electrically connecting a bonding metal formed on an uppermost metal layer of the upper chip and a bonding metal formed on an uppermost metal layer of the lower chip. For example, when the bonding metal is formed of copper (Cu), the bonding method may be a Cu—Cu bonding method, and the bonding metal may also be formed of aluminum or tungsten.

Each of the peripheral circuit area PERI and the cell area CELL of the memory device 300 may include an external pad bonding area PA, a word line bonding area WLBA, and a bit line bonding area BLBA.

The peripheral circuit area PERI may include a first substrate 410, an interlayer insulating layer 415, a plurality of circuit elements 420a, 420b, and 420c formed on the first substrate 410, first metal layers 430a, 430b, and 430c respectively connected to the plurality of circuit elements 420a, 420b, and 420c, and second metal layers 440a, 440b, and 440c respectively formed on the first metal layers 430a, 430b, and 430c. In an embodiment of the inventive concept, the first metal layers 430a, 430b, and 430c may be formed of tungsten having relatively high resistance, and the second metal layers 440a, 440b, and 440c may be formed of copper having relatively low resistance.

In this specification, only the first metal layers 430a, 430b, and 430c and the second metal layers 440a, 440b, and 440c are shown, but the inventive concept is not limited thereto, and at least one or more metal layers may be further formed the second metal layers 440a, 440b, and 440c. At least some of the one or more metal layers formed on the second metal layers 440a, 440b, and 440c may be formed of aluminum having a lower resistance than the copper forming the second metal layers 440a, 440b, and 440c.

The interlayer insulating layer 415 may be disposed on the first substrate 410 to cover the plurality of circuit elements 420a, 420b, and 420c, the first metal layers 430a, 430b, and 430c, and the second metal layers 440a, 440b, and 440c and may include an insulating material such as silicon oxide or silicon nitride.

Lower bonding metals 471b and 472b may be formed on the second metal layer 440b of the word line bonding area WLBA. In the word line bonding area WLBA, the lower bonding metals 471b and 472b of the peripheral circuit area PERI may be electrically connected to the upper bonding metals 371b and 372b of the cell area CELL by using the bonding method, and the lower bonding metals 471b and 472b and the upper bonding metals 371b and 372b may be formed of aluminum, copper, or tungsten.

The cell area CELL may provide at least one memory block. The cell area CELL may include a second substrate 310 and a common source line 320. On the second substrate 310, a plurality of word lines 331 to 338; 330 may be stacked along a direction (Z-axis direction) perpendicular to the upper surface of the second substrate 310. String select lines and a ground select lines may be respectively disposed on upper and lower portions of the word lines 330. The plurality of word lines 330 may be disposed between the string select lines and the ground select line.

In the bit line bonding area BLBA, a channel structure CH may extend in a direction perpendicular to the upper surface of the second substrate 310 to penetrate the word lines 330, the string select lines, and the ground select line. For example, the channel structure CH may extend along the Z-axis direction. The channel structure CH may include a data storage layer, a channel layer, and a buried insulating layer. The channel layer may be electrically connected to the first metal layer 350c and the second metal layer 360c. For example, the first metal layer 350c may be a bit line contact, and the second metal layer 360c may be a bit line. Herein, the second metal layer 360c may be referred to as a bit line. In an embodiment of the inventive concept, the bit line 360c may extend in a first direction (Y-axis direction) parallel to the upper surface of the second substrate 310.

In an embodiment of the inventive concept, an area where the channel structure CH and the bit line 360c are disposed may be referred to as the bit line bonding area BLBA. The bit line 360c may be electrically connected to the circuit elements 420c providing a page buffer 393 of the peripheral circuit area PERI in the bit line bonding area BLBA. For example, the bit line 360c may be connected to a upper bonding metals 371c and 372c of the cell area CELL, and the upper bonding metals 371c and 372c may be connected to lower bonding metals 471c and 472c connected to the circuit elements 420c of the page buffer 393.

In the word line bonding area WLBA, the word lines 330 may extend in a second direction (X-axis direction) parallel to the upper surface of the second substrate 310, and may be connected to a plurality of cell contact plugs 341 to 347; 340. The word lines 330 and the cell contact plugs 340 may be connected to each other on pads provided by extending at least some of the word lines 330 to different lengths in the second direction. A first metal layer 350b and a second metal layer 360b may be sequentially connected to upper portions of the cell contact plugs 340 connected to the word lines 330. The cell contact plugs 340 may be connected to the peripheral circuit area CELL through the upper bonding metals 371b and 372b of the cell area CELL and the lower bonding metals 471b and 472b of the peripheral circuit area PERI in the word line bonding area WLBA.

The cell contact plugs 340 may be electrically connected to circuit elements 420b providing a row decoder 394 in the peripheral circuit area PERI. In an embodiment of the inventive concept, the operating voltage of the circuit elements 420b providing the row decoder 394 may be different from the operating voltage of the circuit elements 420c providing the page buffer 393. For example, the operating voltage of the circuit elements 420c providing the page buffer 393 may be greater than the operating voltage of the circuit elements 420b providing the row decoder 394.

A common source line contact plug 380 may be disposed in the external pad bonding area PA. The common source line contact plug 380 may be formed of a conductive material such as a metal, a metal compound, or polysilicon, and may be electrically connected to the common source line 320. A first metal layer 350a and a second metal layer 360a may be sequentially stacked on the common source line contact plug 380. For example, an area in which the common source line contact plug 380, the first metal layer 350a, and the second metal layer 360a are disposed may be referred to as the external pad bonding area PA. In the external pad bonding area PA, a lower metal pattern 473a of the peripheral circuit area PERI may be electrically connected to upper bonding metals 371a and 372a of the cell area CELL by using the bonding method.

Input/output pads 305 and 405 may be disposed in the external pad bonding area PA. A lower insulating layer 401 covering a lower surface of the first substrate 410 may be formed on a lower portion of the first substrate 410, and a first input/output pad 405 may be formed on the lower insulating layer 401. The first input/output pad 405 may be connected to at least one of the plurality of circuit elements 420a, 420b, and 420c disposed in the peripheral circuit area PERI through a first input/output contact plug 403, and may be separated from the first substrate 410 by the lower insulating layer 401. In addition, a side insulating layer may be disposed between the first input/output contact plug 403 and the first substrate 410 to electrically separate the first input/output contact plug 403 from the first substrate 410.

An upper insulating layer 301 covering an upper surface of the second substrate 310 may be formed on the second substrate 310, and a second input/output pad 305 may be disposed on the upper insulating layer 301. The second input/output pad 305 may be connected to at least one of the plurality of circuit elements 420a, 420b, and 420c disposed in the peripheral circuit area PERI through a second input/output contact plug 303. For example, the second input/output contact plug 303 may be connected to the circuit element 420a through a lower bonding metal 472a.

According to embodiments of the inventive concept, the second substrate 310 and the common source line 320 may not be disposed in an area where the second input/output contact plug 303 is disposed. In addition, the second input/output pad 305 may not overlap the word lines 330 in the third direction (Z-axis direction). The second input/output contact plug 303 may be separated from the second substrate 310 in a direction parallel to the upper surface of the second substrate 310 and connected to the second input/output pad 305 penetrating the interlayer insulating layer of the cell area CELL.

According to embodiments of the inventive concept, the first input/output pad 405 and the second input/output pad 305 may be selectively formed. For example, the memory device 300 may include only the first input/output pad 405 disposed on the upper portion of the first substrate 410, or only the second input/output pad 305 disposed on the upper portion of the second substrate 310 Alternatively, the memory device 300 may include both the first input/output pad 405 and the second input/output pad 305.

In each of the external pad bonding area PA and the bit line bonding area BLBA included in each of the cell area CELL and the peripheral circuit area PERI, a metal pattern of the uppermost metal layer may exist as a dummy pattern, or the uppermost metal layer may be empty.

The memory device 300 may form the lower metal pattern 473a in the same shape as an upper metal pattern 372a on the uppermost metal layer of the peripheral circuit area PERI in correspondence with the upper metal pattern 372a formed on the uppermost metal layer of the cell area CELL in the outer pad bonding area PA. The lower metal pattern 473a formed on the uppermost metal layer of the peripheral circuit area PERI may not be connected to a separate contact in the peripheral circuit area PERI. Similarly, the memory device 300 may form the upper metal pattern in the same shape as the lower metal pattern of the peripheral circuit area PERI on the upper metal layer of the cell area CELL in correspondence with the lower metal pattern formed on the uppermost metal layer of the peripheral circuit area PERI in the outer pad bonding area PA.

The lower bonding metals 471b and 472b may be formed on the second metal layer 240b of the word line bonding area WLBA. In the word line bonding area WLBA, the lower bonding metals 471b and 472b of the peripheral circuit area PERI may be electrically connected to the upper bonding metals 371b and 372b of the cell area CELL by using the bonding method.

In addition, the memory device 300 may form an upper metal pattern 392 in the same shape as a lower metal pattern 452 on the uppermost metal layer of the cell area CELL in correspondence with the lower metal pattern 452 formed on the uppermost metal layer of the peripheral circuit area PERI. A contact may not be formed on the upper metal pattern 392 formed on the uppermost metal layer of the cell area CELL.

In an embodiment of the inventive concept, the memory cell array 210 of FIG. 3 may be disposed in the cell area CELL, and the fail bit calculator 220, the row decoder 230, the page buffer unit 240, the input/output circuit 250, and the control logic circuit 260 of FIG. 3 may be disposed in the peripheral circuit area PERI. Accordingly, as described with reference to FIGS. 1 to 23, the memory device 300 may perform a multi-page program operation. For example, the memory device 300 may read previous page data stored in memory cells connected to a selected word line among the word lines 330 (or one page data of multi-page data) based on two sensing values while performing the multi-page program operation. For example, the read data may be transferred to the page buffer 393 through the upper bonding metal 372c and the lower bonding metal 472c. The memory device 300 may identify an error level of the read previous page data, change read conditions according to the identified error level to read the previous page data again, or correct an error of the read previous page data. For example, the memory device 300 may transmit the previous page data to a memory controller through the first input/output pad 405 or the second input/output pad 305 and receive the error-corrected previous page data from the memory controller through the first input/output pad 405 or the second input/output pad 305. Accordingly, the reliability of the multi-page program operation performed by the memory device 300 may be increased.

Figure 25:
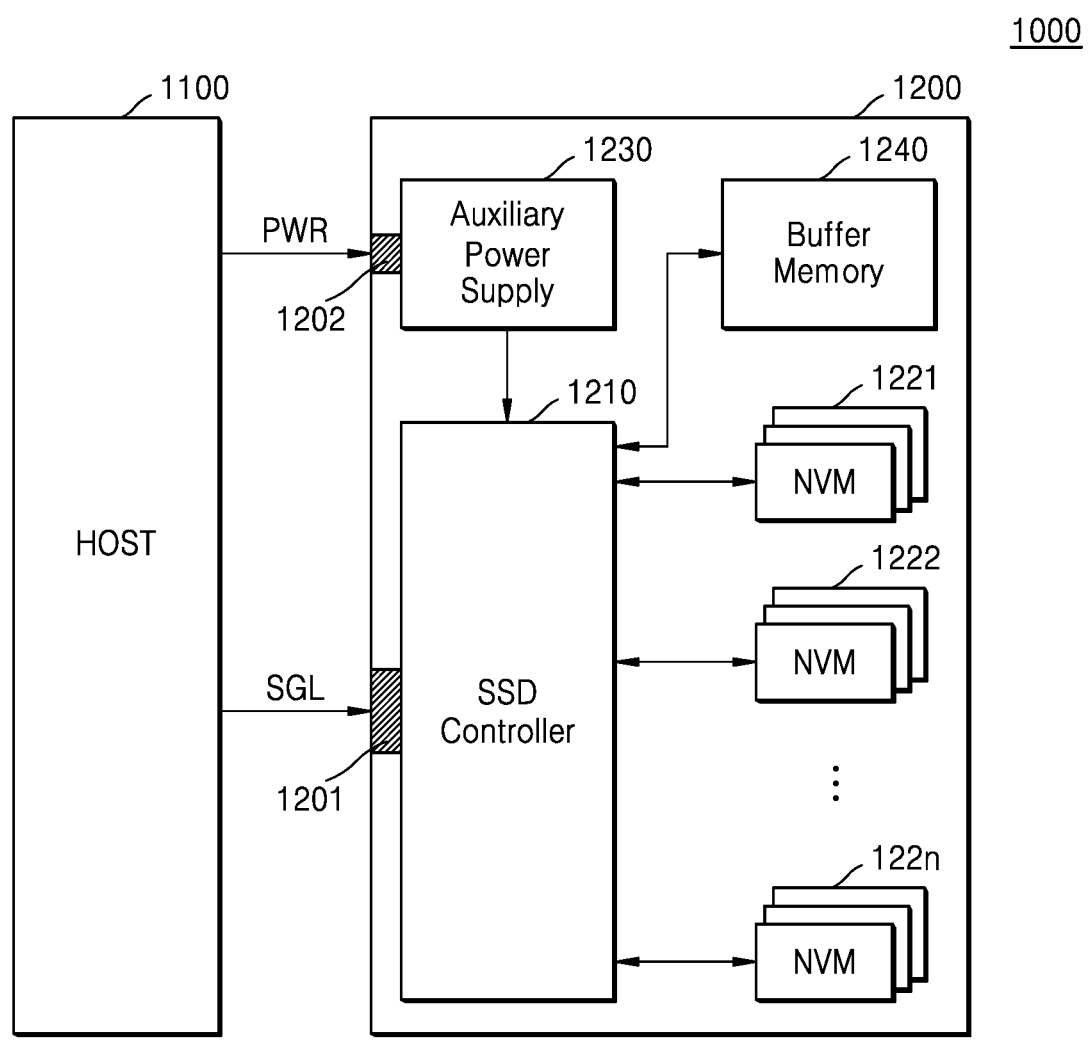
FIG. 25 is a block diagram illustrating a solid state drive (SSD) system to which a memory device according to an embodiment of the inventive concept is applied.

FIG. 25 is a block diagram illustrating an SSD system 1000 to which a memory device is applied according to an embodiment of the inventive concept. Referring to FIG. 25, the SSD system 1000 may include a host 1100 and an SSD 1200.

The SSD 1200 may exchange a signal SGL with the host 1100 through a signal connector 1201 and receive power PWR through the power connector 1202. The SSD 1200 may include an SSD controller 1210, a plurality of flash memories 1221 to 122n, an auxiliary power supply 1230, and a buffer memory 1240. The plurality of flash memories 1221 to 122n may be connected to the SSD controller 1210 through a plurality of channels, respectively.

The SSD controller 1210 may control the plurality of flash memories 1221 to 122n in response to the signal SGL received from the host 1100. The SSD controller 1210 may store a signal generated internally or transmitted from the outside (e.g., the signal SGL received from the host 1100) in the buffer memory 1240. The SSD controller 1210 may correspond to the memory controller 100 described above with reference to FIGS. 1 to 23.

The plurality of flash memories 1221 to 122n may operate under the control of the SSD controller 1210. The auxiliary power supply 1230 is connected to the host 1100 through the power connector 1202. Each of the plurality of flash memories 1221 to 122n may correspond to the nonvolatile memory device 200 described above with reference to FIGS. 1 to 23. For example, each of the plurality of flash memories 1221 to 122n may read previous page data stored in memory cells connected to a selected word line (or one page data of multi-page data) based on two sensing values during a multi-page program operation. Each of the plurality of flash memories 1221 to 122n may identify an error level of the read previous page data and change read conditions according to the identified error level to read the previous page data again or correct an error of the read previous page data. Accordingly, the reliability of the multi-page program operation performed by each of the plurality of flash memories 1221 to 122n may be increased.

The auxiliary power supply 1230 may be connected to the host 1100 through the power connector 1202. The auxiliary power supply 1230 may receive the power PWR from the host 1100 and may be charged. The auxiliary power supply 1230 may provide power to the SSD 1200 when power supply from the host 1100 is not smooth.

While the inventive concept has been particularly shown and described with reference to embodiments thereof, it will be understood that various changes in form and details may be made thereto without departing from the spirit and scope of the inventive concept as set forth in the following claims.

What is claimed is:

1. An operating method of a nonvolatile memory device for programming multi-page data, the operating method comprising:
   receiving the multi-page data from a memory controller;
   programming first page data among the multi-page data to first memory cells connected to a word line adjacent to a selected word line;
   reading previous page data previously stored in second memory cells connected to the selected word line based on a first sensing value and a second sensing value after programming the first page data; and
   programming the previous page data read from the second memory cells and second page data among the multi-page data to the second memory cells.

2. The operating method of claim 1, further comprising receiving a program command with respect to the multi-page data from the memory controller,
   wherein the programming of the first page data is performed in response to the program command.

3. The operating method of claim 1, further comprising: calculating a first fail bit number by comparing first bits of the previous page data read based on the first sensing value to second bits of the previous page data read based on the second sensing value,
   wherein the programming of the previous page data comprises: programming the previous page data and the second page data to the second memory cells based on the first fail bit number.

4. The operating method of claim 1, further comprising:
   transmitting the previous page data read from the second memory cells to the memory controller;
   receiving, from the memory controller, previous correction page data generated by correcting an error of the read previous page data; and
   programming the previous correction page data and the second page data to the second memory cells.

5. The operating method of claim 4, wherein the transmitting of the read previous page data to the memory controller comprises:
   transmitting a ready/busy signal in a ready state and a read fail flag to the memory controller;
   receiving a data output command with respect to the previous page data from the memory controller after transmitting the ready/busy signal and the read fail flag; and
   transmitting the read previous page data to the memory controller in response to the data output command.

6. The operating method of claim 4, further comprising receiving a resume command from the memory controller,
   wherein the programming of the previous correction page data and the second page data to the second memory cells is performed in response to the resume command.

7. The operating method of claim 4, wherein a ready/busy signal transmitted from the nonvolatile memory device to the memory controller is maintained in a busy state while a program operation on the first page data, a read operation, and a program operation on the second page data are performed, and
   the ready/busy signal indicates a ready state while a transmission operation of the previous page data, a reception operation of the previous correction page data, and a reception operation of the resume command are performed.

8. The operating method of claim 1, further comprising transmitting state information indicating a program fail with respect to the multi-page data to the memory controller.

9. An operating method of a nonvolatile memory device for programming multi-page data, the operating method comprising:
   receiving first page data among the multi-page data from a memory controller;
   programming the first page data to memory cells connected to a selected word line;
   receiving second page data among the multi-page data from the memory controller after programming the first page data;
   reading the first page data stored in the memory cells based on a first sensing value and a second sensing value after receiving the second page data; and
   programming the first page data read from the memory cells and the second page data to the memory cells.

10. The operating method of claim 9, further comprising:
    calculating a first fail bit number by comparing first bits of the first page data read based on the first sensing value to second bits of the first page data read based on the second sensing value,
    wherein the programming of the first page data comprises:
    programming the first page data read from the memory cells and the second page data to the memory cells based on the first fail bit number.

11. The operating method of claim 10, wherein, when the first fail bit number is less than a first reference value, the second page data is programmed to the memory cells.

12. The operating method of claim 11, further comprising:
    transmitting the first page data read from the memory cells to the memory controller, when the first fail bit number is greater than or equal to the first reference value and less than a second reference value greater than the first reference value;
    receiving, from the memory controller, first correction page data generated by correcting an error of the read first page data; and
    programming the first correction page data and the second page data to the memory cells.

13. The operating method of claim 12, wherein the transmitting of the read first page data to the memory controller comprises:
    transmitting a ready/busy signal in a ready state and a read fail flag to the memory controller;
    receiving a data output command with respect to the first page data from the memory controller after transmitting the ready/busy signal and the read fail flag; and
    transmitting the read first page data to the memory controller in response to the data output command.

14. The operating method of claim 12, further comprising receiving a resume command from the memory controller,
    wherein the programming of the first correction page data and the second page data to the memory cells is performed in response to the resume command.

15. The operating method of claim 12, further comprising transmitting state information indicating a program fail with respect to the multi-page data to the memory controller, when the first fail bit number is greater than or equal to the second reference value.

16. An operating method of a nonvolatile memory device for programming multi-page data, the operating method comprising:
   receiving the multi-page data from a memory controller;
   programming at least one page data among the multi-page data to first memory cells connected to a word line adjacent to a selected word line;
   reading at least one previous page data previously stored in second memory cells connected to the selected word line based on a first read voltage and a second read voltage after programming the at least one page data; and
   programming the at least one previous page data read from the second memory cells and remaining page data among the multi-page data to the second memory cells.

17. The operating method of claim 16, wherein the programming of the at least one previous page data comprises: programming the at least one previous page data read from the second memory cells and the remaining page data to the second memory cells, when a number of failing cells having a threshold voltage between the first read voltage and the second read voltage among the second memory cells is less than a reference value, and
   wherein the operating method further comprises: transmitting state information indicating a program fail with respect to the multi-page data to the memory controller, when the number of failing cells is greater than or equal to the reference value.

18. The operating method of claim 16, further comprising:
   transmitting the at least one previous page data read from the second memory cells to the memory controller;
   receiving, from the memory controller, at least one previous correction page data generated by correcting an error of the at least one previous data; and
   programming the at least one previous correction page data and the remaining page data to the second memory cells.

19. The operating method of claim 18, wherein the transmitting of the at least one previous data to the memory controller comprises:
   transmitting a ready/busy signal in a ready state and a read fail flag to the memory controller;
   receiving a data output command with respect to the at least one previous data from the memory controller after transmitting the ready/busy signal and the read fail flag; and
   transmitting the at least one previous page data to the memory controller in response to the data output command.

20. The operating method of claim 18, further comprising receiving a resume command from the memory controller,
   wherein the programming of the previous correction page data and the remaining page data to the second memory cells is performed in response to the resume command.

* * * * *